(12) United States Patent
Danesh et al.

(10) Patent No.: US 9,823,275 B2
(45) Date of Patent: Nov. 21, 2017

(54) ELECTRICAL SIGNAL MEASUREMENT

(71) Applicant: Analog Devices Global, Hamilton (BM)

(72) Inventors: Seyed Amir Ali Danesh, Edinburgh (GB); William Michael James Holland, Edinburgh (GB); John Stuart, Edinburgh (GB); Jonathan Ephraim David Hurwitz, Edinburgh (GB)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/895,868

(22) PCT Filed: May 30, 2014

(86) PCT No.: PCT/GB2014/051676
§ 371 (c)(1),
(2) Date: Dec. 3, 2015

(87) PCT Pub. No.: WO2014/191776
PCT Pub. Date: Dec. 4, 2014

(65) Prior Publication Data
US 2016/0154029 A1    Jun. 2, 2016

(30) Foreign Application Priority Data
Jun. 1, 2013   (GB) .................................. 1309823.1

(51) Int. Cl.
*G01R 27/08*    (2006.01)
*G01R 19/00*    (2006.01)
(Continued)

(52) U.S. Cl.
CPC ........... *G01R 17/00* (2013.01); *G01R 15/144* (2013.01); *G01R 15/146* (2013.01); *G01R 17/02* (2013.01);
(Continued)

(58) Field of Classification Search
CPC ........................ G01R 19/00; G01R 19/0084; G01R 19/0092; G01R 19/16542; G01R 19/25;
(Continued)

(56) References Cited

U.S. PATENT DOCUMENTS 4,416,341 A * 11/1983 Hirano ................. G01G 19/393
177/1
4,423,458 A    12/1983 Stich et al.
(Continued)

FOREIGN PATENT DOCUMENTS

CN    101023367 A    8/2007
CN    101535821 A    9/2009
(Continued)

OTHER PUBLICATIONS

"International Application Serial No. PCT/GB2014/051676, International Preliminary Report on Patentability mailed Dec. 10, 2015", 8 pgs.
(Continued)

*Primary Examiner* — Hoai-An D Nguyen
(74) *Attorney, Agent, or Firm* — Schwegman Lundberg & Woessner, P.A.

(57) ABSTRACT

The present invention relates to electrical measurement apparatus (10). The electrical measurement apparatus (10) comprises a measurement arrangement (20,24) configured to be disposed in relation to an electrical circuit (12,14,16,18) which bears an electrical signal, the measurement arrangement (20,24) being operative when so disposed to measure the electrical signal. The electrical measurement apparatus (10) further comprises a signal source (22) operative to apply a reference input signal to the measurement arrangement (20,24) whereby an output signal from the measurement arrangement comprises an electrical output signal corresponding to the electrical signal and a reference output (Continued)

signal corresponding to the reference input signal, the reference input signal having a substantially piecewise constant form which is repeated over each of plural cycles. The electrical measurement apparatus (10) yet further comprises processing apparatus (26) which is operative: to determine at least one cumulative representation, determination of the cumulative representation comprising summing plural received sections of the output signal, each of the plural received sections corresponding to at least a part and to a same part of the cycle of the reference input signal; and to determine at least one of: a transfer function for the measurement arrangement; a change in a transfer function for the measurement arrangement; and the electrical signal, in dependence on the at least one cumulative representation and the reference input signal.

39 Claims, 9 Drawing Sheets

(51) Int. Cl.
| | |
|---|---|
| *G01R 17/00* | (2006.01) |
| *G01R 17/02* | (2006.01) |
| *G01R 15/14* | (2006.01) |
| *G01R 27/14* | (2006.01) |
| *G01R 19/25* | (2006.01) |
| *G01R 1/20* | (2006.01) |
| *G01R 19/165* | (2006.01) |

(52) U.S. Cl.
CPC ..... *G01R 19/0084* (2013.01); *G01R 19/0092* (2013.01); *G01R 19/2513* (2013.01); *G01R 27/14* (2013.01); *G01R 1/203* (2013.01); *G01R 19/16542* (2013.01); *G01R 27/08* (2013.01)

(58) Field of Classification Search
CPC .... G01R 19/2513; G01R 17/00; G01R 17/02; G01R 27/00; G01R 27/02; G01R 27/08; G01R 27/14; G01R 27/16; G01R 1/20; G01R 1/203; G01R 15/00; G01R 15/14; G01R 15/144; G01R 15/146
USPC .......... 324/76.11, 76.12, 500, 512, 522, 600, 324/615, 649, 691, 713; 702/1, 57, 64, 702/108, 109, 117, 127, 182, 183
See application file for complete search history.

(56) References Cited

U.S. PATENT DOCUMENTS

| | | | | |
|---|---|---|---|---|
| 5,341,432 | A * | 8/1994 | Suzuki | G10L 21/04 704/211 |
| 5,804,979 | A | 9/1998 | Lund et al. | |
| 5,854,995 | A | 12/1998 | Plis et al. | |
| 6,173,236 | B1 | 1/2001 | Elmore et al. | |
| 7,050,588 | B1 * | 5/2006 | Wajs | H04N 7/1675 348/E7.056 |
| 7,746,065 | B2 * | 6/2010 | Pastre | G01R 33/0035 324/202 |
| 8,005,637 | B2 | 8/2011 | Bengtsson | |
| 8,195,416 | B2 * | 6/2012 | Tsuda | G01R 23/20 702/189 |
| 9,151,818 | B2 * | 10/2015 | Danesh | G01R 21/133 |
| 9,322,850 | B2 * | 4/2016 | Wood | G01R 1/203 |
| 2002/0054625 | A1 * | 5/2002 | Matsumoto | H04B 1/7075 375/152 |
| 2008/0225457 | A1 | 9/2008 | Korrek | |
| 2012/0286862 | A1 | 11/2012 | Korrek | |
| 2012/0287342 | A1 * | 11/2012 | Matsui | H04N 5/10 348/540 |
| 2012/0299578 | A1 | 11/2012 | Korrek | |
| 2013/0113507 | A1 | 5/2013 | Danesh et al. | |
| 2014/0176119 | A1 * | 6/2014 | Hull | G01R 19/175 324/123 C |

FOREIGN PATENT DOCUMENTS

| | | |
|---|---|---|
| CN | 102176114 A | 9/2011 |
| CN | 102645574 A | 8/2012 |
| EP | 1637898 A1 | 3/2006 |
| WO | WO-2006/002446 A1 | 1/2006 |
| WO | WO-213/038176 A2 | 3/2013 |
| WO | WO-2014/072733 A2 | 5/2014 |

OTHER PUBLICATIONS

"International Application Serial No. PCT/GB2014/051676, International Search Report mailed Oct. 31, 2014", 4 pgs.
"International Application Serial No. PCT/GB2014/051676, Written Opinion mailed Oct. 31, 2014", 6 pgs.
Ziegler, Silvio, et al., "Current Sensing Techniques: A Review", *IEEE Sensors Journal*, vol. 9. No. 4, (Apr. 2009), 354-376.
"Chinese Application Serial No. 201480030949.4, Office Action dated Apr. 21, 2017", (w/ English Translation), 20 pgs.
"European Application Serial No. 14734206.7, Office Action dated Jan. 21, 2016", 2 pgs.
"European Application Serial No. 14734206.7, Response filed Jun. 2, 2016 to Office Action dated Jan. 21, 2016", 23 pgs.

* cited by examiner

*

=

ELECTRICAL SIGNAL MEASUREMENT

RELATED APPLICATION

This application is a U.S. National Stage Filing under 35 U.S.C. §371 of International Patent Application Serial No. PCT/GB2014/051676, filed May 30, 2014, and published on Dec. 4, 2014, as WO 2014/191776 A1, which claims priority to GB Application Serial No. 1309823.1, filed Jun. 1, 2013, which are incorporated herein by reference in their entirety.

FIELD OF THE INVENTION

The present invention relates to electrical measurement apparatus and electrical measurement methods, in particular but not exclusively for measuring high levels of current and line voltage present in electricity consumption circuits, electricity generation circuits and the like. The present invention further relates to apparatus, such as electricity storage, generation, transmission, distribution or consumption apparatus, which comprises such electrical measurement apparatus or is operative according to such electrical measurement methods.

BACKGROUND ART

A current shunt provides for indirect measurement of current values by measurement of the voltage developed across the current shunt by the current passing through the current shunt. Typical applications for current shunts include electricity usage control, over-current protection and metering of electricity consumption and generation. In use a current shunt of known resistance is provided in series with a load and the voltage developed across the current shunt by the load drawn current is measured. The current passing through the current shunt is then determined on the basis of Ohm's Law in view of the measured voltage and the known resistance of the shunt.

Certain applications, such as metering of electricity consumption and generation, require measurement to high accuracy over extended periods of time. For example in North America the ANSI C12.20 standard specifies an accuracy of ±0.5% for Class 0.5 consumption meters and ±0.2% for Class 0.2 consumption meters. Standards applicable in Europe and elsewhere, such as IEC 62053, specify similar accuracy requirements. It can therefore be appreciated that the resistance of the current shunt must be known to high precision to enable a meter to meet regulated accuracy requirements. Although the shunt resistance is normally low to minimise power dissipation and undesirable circuit effects, the current shunt is nevertheless liable to heating with temperature drift giving rise to a change in resistance which may cause a loss of measurement accuracy in a shunt of ordinary temperature coefficient of resistance. Shunt resistors formed from manganin alloy are therefore widely used in view of their very low temperature coefficient of resistance. It may also be apparent that accurate current measurement depends on measurement of the voltage developed across the shunt being accurate and stable with temperature and lifetime. This is because a change in the transfer gain of the voltage measurement circuit or lack of precision in references used in the voltage measurement circuit will cause an error. It is normal for these reasons to perform a one-off factory calibration when the current shunt and the readout electronics are combined so that a factor related to the actual combined transfer function for current to measurement value, which is determined largely by the shunt resistor and voltage measurement, can be stored and used in subsequent measurements to achieve the desired precision.

An alternative known approach to measuring high values of current involves the use of a current transformer wound on a core, which is disposed around a conductor carrying current to be measured. The current transformer has the advantages over the shunt resistor of being less invasive and providing for isolation from the current carrying conductor. The current transformer is capable of measuring AC current only. The current transformer generates a current in the secondary coil, which is a ratio of the current in the primary conductor, and the secondary coil current is then turned into a voltage by a load, known as a burden resistor. Accurate measurement of the voltage across the burden resistor and accurate knowledge of the transfer function of the primary current to voltage across the burden resistor (i.e. combining the effect of number of turns, the magnetics and the burden resistor) are needed to measure the current accurately and precisely. As with the current shunt, one-off factory calibration is often performed to compensate for inaccuracies in some or all of the elements that contribute to the overall transfer function of primary current to measurement value.

Another approach uses a Hall current probe which is capable of measuring both AC and DC. In an open loop configuration the Hall current probe is, however, liable to non-linearity and temperature drift. In a closed loop configuration the Hall current probe provides an improvement with regards to non-linearity and temperature drift although the weight and size of the configuration increases significantly where higher currents are measured. It is further known to use the Rogowski coil current probe to measure high levels of current. Most known approaches to current measurement, such as by way of the shunt resistor, the current transformer, the Rogowski coil and the Hall current probe, are described and discussed in *Current Sensing Techniques: A Review*, Silvio Ziegler Robert C. Woodward and Herbert Ho-Ching Iu, IEEE Sensors Journal, Vol. 9, No. 4, April 2009. The different known approaches have their respective advantages and disadvantages.

Load current measurement is often made in conjunction with line voltage measurement, which involves measuring the voltage between the conductors over which the current is delivered, in order to determine the electrical power. Often a resistive potential divider between the conductors is employed for line voltage measurement. High accuracy power calculation requires accurate and stable relative phase and frequency response of load current and line voltage measurements in order to accurately determine metrics such as the like of power factor, harmonic content and differences between active and reactive power amongst other things.

WO 2013/038176 describes an improved approach to the measurement of current. According to the approach of WO 2013/038176 a current sensor, such as a current shunt, a current transformer, a Hall current probe or a Rogowski coil, is disposed as described above relative to a conductor to sense a load drawn current flowing through the conductor. A reference signal which is known to high precision is applied to the current sensor whereby the current sensor is responsive to both the load drawn current signal and the applied reference signal. The output signal from the current sensor is acquired and the part of the output signal corresponding to the reference signal is extracted from the output signal. Then the transfer function of the current sensor and the current sensor processing chain is determined on the basis of the reference signal and the extracted part of the output signal corresponding to the reference signal. Thereafter the actual load drawn current flowing through the conductor is determined in dependence on the transfer function and the load drawn current as sensed by the current sensor. Accuracy of measurement of the load drawn current therefore depends on the reference signal being known to high precision instead of the current sensor and its processing chain being known to high precision as according to the previously described approaches. The lack of reliance on the known precision of the current sensor means a lower quality sensor may be used. There is also less need for initial calibration and periodic subsequent recalibration of the current sensor and its processing chain. Furthermore the approach of WO 2013/038176 addresses drift of the current sensor and its processing chain arising from the like of ageing and temperature change and also provides for additional functionality, such as the detection of tampering with electricity consumption meters.

The approach of WO 2013/038176 relies on proper extraction of the part of the output signal corresponding to the reference signal from the rest of the output signal. According to WO 2013/038176 a reference signal in the form of a sine wave is applied to the current sensor. Frequency domain analysis, such as FFT analysis, of the output signal is used to separate the part of the output signal corresponding to the reference signal from the rest of the output signal.

The present inventors have recognised that an increase in the power of the applied reference signal is beneficial, for example, in respect of the signal to noise ratio of the extracted part of the output signal corresponding to the reference signal. Furthermore a square wave carries more power than a sine wave for the same amount of power drawn from the power supply. A reference signal in the form of a square wave therefore carries more power than a reference signal in the form of a sine wave for the same power drawn from the power supply. The present inventors have further recognised, however, that extraction of the part of the output signal corresponding to a square wave reference signal from the output signal by frequency domain analysis is liable to be computationally intensive because one needs to take the plural tones of the square wave into account.

In view of the foregoing considerations the present inventors have concluded that time domain processing of the output signal may be preferable to frequency domain processing of the output signal. This conclusion, however, leads to the further problem of how to extract the part of the output signal corresponding to the reference signal from the rest of the output signal. This problem presents a particular challenge because in the current measurement apparatus of WO 2013/038176 the amplitude of the reference signal is normally much smaller than the amplitude of the load drawn current signal comprised in the rest of the output signal.

A potential attenuator provides for measurement of voltages in apparatus where the electrical signals are of larger magnitude than the acceptable dynamic range of the measurement apparatus. For example in mains electricity metering, where the AC line voltage between the live conductor and neutral conductor is 230V RMS and the measurement apparatus is restricted to a few volts DC relative to one of the conductors, a potential attenuator with a division ratio of a few hundred to a few thousand allows the measurement apparatus to determine the line voltage depending on knowledge of the attenuation factor of the potential attenuator and the gain of the measurement apparatus. Similarly in DC apparatus such as a battery monitor a potential attenuator allows for the battery voltage, which may be greater than 10 volts, to be accommodated by measurement apparatus having a supply voltage in the few volts range provided a transfer function of the measurement apparatus including the potential attenuator is known. This puts a requirement on accuracy and precision of both the potential attenuator and the measurement apparatus. In its simplest form the potential attenuator is a resistor divider comprising a large first resistor and a smaller second resistor which are connected in series between the two conductors. The accuracy of such a potential attenuator is determined by the attenuation factor of the first and second resistors being known, e.g. from measurement during calibration of the whole apparatus. The subsequent precision of the attenuation factor depends on the relative change of the resistors' values under changing conditions such as temperature and ageing. Maintaining accuracy over lifetime whilst being subject to environmental change imposes requirements on the resistors in terms of temperature coefficients, power handling, physical location, local stress and other factors that affect resistance values. Additionally the measurement apparatus is required to be stable with temperature and lifetime and other environmental changes. A more complex form of potential attenuator comprises an active circuit. For example this form of potential attenuator comprises an amplifier in an inverting configuration with a large input resistor and a small feedback resistor joined at the virtual earth of the amplifier. The virtual earth of the amplifier is electrically coupled to a first conductor and the first resistor is electrically coupled to a second conductor whereby the potential attenuator is operative to attenuate the voltage between the first and second conductors.

WO 2014/072733 describes an improved approach to the measurement of voltage. One configuration of measurement apparatus described in WO 2014/072733 measures voltage between a first conductor and a second conductor. The measurement apparatus comprises a potential attenuator, which has a first resistor and a reference resistor arrangement, and an offset voltage circuit. The offset voltage circuit comprises, for example, a passive resistor divider in series with an offset voltage. The measurement apparatus is configured such that the offset voltage circuit applies an offset voltage between the first conductor and the second conductor. The offset voltage is switched between values or is modulated with a more complex signal to create a reference input signal, which affects the potential attenuator by the same attenuation factor as for voltage measurement between the first and second conductors. The reference input signal which is known to high precision is applied to the potential attenuator, which is responsive to both the line voltage signal between the first and second conductors and the applied reference input signal. The output signal from the potential attenuator is measured and the reference output signal, which is the part of the output signal corresponding to the reference input signal, is extracted from the output signal. Then the overall transfer function of the potential attenuator and the voltage processing chain is determined on the basis of the reference input signal and the extracted part of the output signal corresponding to the reference input signal. Thereafter the actual voltage between the first and second conductors is determined in dependence on the transfer function and the line voltage measured by the potential attenuator. Accuracy of measurement of the line voltage therefore depends on the reference signal being known to high precision instead of the potential attenuator and its processing chain being known to high precision as according to previously described approaches. The lack of reliance on the known precision of the potential attenuator means lower quality components can be used. There is also less need for initial calibration and periodic subsequent recalibration of the potential attenuator and its processing chain. Furthermore the approach of WO 2014/072733 addresses drift of the potential attenuator and its processing chain arising from the like of ageing and temperature change and also provides for additional functionality, such as on-line monitoring of deployed accuracy of the voltage measurement or the detection of faults in electricity consumption meters.

The measurement apparatus of WO 2014/072733 in common with the measurement apparatus of WO 2013/038176 relies on an ability to extract the reference output signal from an output signal from the measurement apparatus. The output signal also contains a line voltage output signal corresponding to the electrical signal being measured (i.e. current or line voltage) which may have components similar in nature to the reference input signal and which may be more than an order of magnitude greater than the reference output signal. WO 2014/072733 would similarly benefit from reliable time domain extraction of the reference output signal.

The present invention has been devised in the light of the above described problems. It is therefore an object for the present invention to provide electrical measurement apparatus which is configured to provide for accurate measurement of an electrical signal, for example a mains current signal or a mains line voltage signal, in dependence on time domain processing. It is another object for the present invention to provide a method of measuring an electrical signal accurately, for example a mains current signal or a mains line voltage signal, in dependence on time domain processing.

STATEMENT OF INVENTION

According to a first aspect of the present invention there is provided electrical measurement apparatus comprising:
 a measurement arrangement configured to be disposed in relation to an electrical circuit which bears an electrical signal, the measurement arrangement being operative when so disposed to measure the electrical signal;
 a signal source operative to apply a reference input signal to the measurement arrangement whereby an output signal from the measurement arrangement comprises an electrical output signal corresponding to the electrical signal and a reference output signal corresponding to the reference input signal, the reference input signal having a substantially piecewise constant form which is repeated over each of plural cycles; and
 processing apparatus which is operative: to determine at least one cumulative representation, determination of the cumulative representation comprising summing plural received sections of the output signal, each of the plural received sections corresponding to at least a part and to a same part of the cycle of the reference input signal; and to determine at least one of: a transfer function for the measurement arrangement; a change in a transfer function for the measurement arrangement; and the electrical signal, in dependence on the at least one cumulative representation and the reference input signal.

The signal source of electrical measurement apparatus according to the present invention is operative to apply a reference input signal having a substantially piecewise constant form, such as a square wave, to the measurement arrangement. For a given level of power consumption by the signal source a signal of piecewise constant form, such as a square wave, may result in the application of a reference input signal of greater power to the electrical measurement apparatus than a reference input signal of sinusoidal form. The present invention may therefore provide for an increase in power applied to the electrical measurement apparatus for a given level of power consumption to thereby derive a benefit such as in respect of the signal to noise ratio of the measured output signal. Alternatively the present invention may provide for a decrease in power consumption by the signal source without reducing the power of the reference input signal. The processing apparatus is operative to determine at least one cumulative representation. Determination of the cumulative representation comprises summing plural successively received sections of the output signal with each of the received sections corresponding to at least a part and to a same part of the cycle of the reference input signal. A consequence of determining the cumulative representation may be the retention of the part of the output signal corresponding to the reference input signal. A further consequence of determining the cumulative representation may be the loss of the part or parts of the output signal which do not correspond to the reference input signal such as the part of the output signal corresponding to the electrical signal. This is because signals comprised in the output signal which have a different fundamental frequency and harmonics to the reference input signal or which have a phase which changes over time with respect to the reference input signal appear uncorrelated to each other and therefore may average over time to zero. Determining the cumulative representation may therefore remove or extract the part of the output signal corresponding to the reference input signal from the rest of the output signal. The electrical measurement apparatus then determines at least one of: the transfer function for the measurement apparatus; a change in the transfer function for the measurement arrangement; and the electrical signal, in dependence on an input to the measurement apparatus, i.e. the reference input signal, and an output from the measurement apparatus in the form of at least one cumulative representation which represents the part of the output signal corresponding to the reference input signal.

The electrical circuit may bear a current signal, such as a mains current signal drawn by a load. The measurement arrangement may therefore be configured to measure the current signal and the electrical output signal comprised in the output signal may correspond to the current signal. The measurement arrangement may comprise a current sensor, such as a shunt resistor, which is operative to measure the current signal. The signal source may be configured to apply the reference input signal as a current.

Alternatively or in addition the electrical circuit may bear a voltage signal, such as a mains line voltage between two conductors. The measurement arrangement may therefore be configured to measure the voltage signal and the electrical output signal comprised in the output signal may correspond to the voltage signal. The measurement arrangement may comprise a potential attenuator which is operative to measure the voltage signal. The signal source may be configured to apply the reference input signal as a voltage.

Determination of at least one of: the transfer function for the measurement apparatus; a change in the transfer function for the measurement arrangement; and the electrical signal may comprise determining at least one cumulative amplitude in dependence on the at least one cumulative representation. The cumulative amplitude may represent an amplitude of at least a part of the reference output signal. In view of the reference input signal having a substantially piecewise constant form, the cumulative amplitude may correspond to a difference between first and second levels comprised in the at least one cumulative representation. For example and where the reference input signal has the form of a square or rectangular wave, the cumulative amplitude may correspond to a difference between at least one high level and at least one low level of the at least one cumulative representation. Determination of at least one of: the transfer function for the measurement apparatus; a change in the transfer function for the measurement arrangement; and the electrical signal may further comprise determining at least one reference signal amplitude in respect of the reference input signal. The reference signal amplitude may represent an amplitude of at least a part of the reference input signal. Likewise and where the reference input signal has the form of a square or rectangular wave, the reference signal amplitude may correspond to a difference between at least one high level and at least one low level of the reference input signal. Thereafter at least one of: the transfer function for the measurement apparatus; a change in the transfer function for the measurement arrangement; and the electrical signal may be determined in dependence on the at least one cumulative amplitude and the at least one reference signal amplitude. Determining at least one of: the transfer function for the measurement apparatus; a change in the transfer function for the measurement arrangement; and the electrical signal may comprise dividing a cumulative amplitude by a reference signal amplitude.

There may be variation within a cumulative representation. Such variation may be caused by noise. Alternatively such variation may be caused by settling of the measurement arrangement. For example and where the reference input signal has the form of a square wave a cumulative representation corresponding to a high part of the square wave may change slightly between the start and the end of the cumulative representation. Such a slight change may be present in the high part after settling of the rising edge transition. The processing apparatus may therefore be operative to sum plural different parts of the at least one cumulative representation. The processing apparatus may be further operative to divide the summed plural parts by the number of parts to thereby determine an averaged cumulative representation. Alternatively the processing apparatus may be operative to provide for division by the number of parts at any one of several operative steps of the processing apparatus. For example the division may be carried out after the step of determining the cumulative amplitude and before the step of dividing the cumulative amplitude by the reference signal amplitude.

Summing plural received sections of the output signal may result in scaling up of the part of the output signal corresponding to the reference input signal. The processing apparatus may therefore be operative to scale down the transfer function to thereby address the scaling up caused by the summing step. Scaling down may comprise division by the number of the received sections summed to determine the cumulative representation. As described later, a windowing function may be applied to the output signal. The application of the windowing function may result in scaling of the output signal. The processing apparatus may therefore be operative to scale the transfer function to thereby compensate for scaling caused by at least one of: summing of the plural received sections of the output signal; and application of a windowing function to the output signal. The scaling step may be carried out at any one of several operative steps of the processing apparatus. The scaling may, for example, be carried out after the summing step and before the step of determining the cumulative amplitude or after the step of determining the cumulative amplitude and before the step of dividing the cumulative amplitude by the reference signal amplitude.

The measurement arrangement is normally of limited bandwidth and may have a complex phase and frequency response. The measurement arrangement may therefore not respond immediately to a reference input signal of piecewise constant form, such as a square wave. For example the measurement arrangement may be operative to rise to a level corresponding to a high level of a square wave reference input signal after a period of time determined by a time constant of the measurement arrangement. The reference output signal may therefore comprise a portion immediately after each transition of the reference input signal in which there is a slow rise or fall which may also be followed by some overshoot before settling thereafter to a substantially constant level. In view of this the processing apparatus may be operative such that the transfer function is determined in respect of less than a whole cycle of the reference input signal, such as at least one part of the whole cycle. According to an approach the processing apparatus may be operative such that the at least one cumulative representation corresponds to less than a whole cycle of the reference input signal. More specifically an initial cumulative representation may be determined in dependence on summing of plural received sections of the output signal and the processing apparatus may be operative to provide first and second cumulative representations corresponding to different parts of the initial cumulative representation, the first and second cumulative representations corresponding to less than the whole initial cumulative representation. Alternatively the processing apparatus may be operative to determine the at least one cumulative representation in dependence on plural received sections which each correspond to a part of the cycle of the reference input signal.

Summing plural received sections of the output signal may comprise summing corresponding subsections of the plural received sections, the corresponding subsections being selected in dependence on at least one of: pre-characterisation of behaviour of the measurement arrangement; and analysis of behaviour of the measurement arrangement during operation of the electrical measurement apparatus. Operation of the processing apparatus such that the transfer function is determined in respect of subsections of the plural received sections may comprise determining at least one of: the number of subsections of the plural received sections and a length of subsections of the plural received sections. The determination in respect of subsections of the plural received sections may be made on a predetermined basis. For example the subsections may be selected on the basis of pre-characterisation of behaviour of the measurement arrangement, such as in respect of the length of rise and fall times of the measurement arrangement. Alternatively the subsections may be selected on the basis of analysis of behaviour of the measurement arrangement during operation of the electrical measurement apparatus. The behaviour of the measurement arrangement may be analysed on a periodic basis. By way of example a window may be moved relative to plural successive cumulative representations and a selection of subsections made in dependence on a comparison of change in the cumulative representation within the window with respect to a threshold value.

The processing apparatus may be operative to determine the transfer function in respect of at least one part of the cycle which is identified as having the like of a transition related variation. More specifically the processing apparatus may be operative to apply weighting in respect of such a part of the cycle, the weighting being determined, for example, by way of pre-characterisation of behaviour of the measurement arrangement. The weighting applied in respect of such a part of the cycle may differ from weighting applied in respect of a different part of the cycle. Use of a more heavily weighted part of the cycle in transfer function determination may provide for an improvement in signal to noise ratio.

The processing apparatus may be operative to determine a time delay of at least one transition of the reference output signal relative to a respective at least one transition of the reference input signal. Transitions of the cumulative representation may correspond to transitions of the reference output signal. The processing apparatus may be operative in respect of the time delay on at least one transition of the cumulative representation. The transfer function may be determined in dependence on at least one time delay and at least one cumulative amplitude to thereby provide a transfer function in respect of phase and amplitude.

The processing arrangement may be operative to determine the at least one cumulative representation on an ongoing basis. More specifically a first cumulative representation may be determined by summing a first plurality of received sections and a second cumulative representation may be determined subsequently by summing a second plurality of received sections, the second plurality of received sections comprising at least one more recently received section absent from the first plurality. The first and second plurality of sections may be the same in number.

The present inventors have appreciated that summing the plural sections may not provide for proper rejection of the electrical signal and have realised that this problem may be addressed by the application of a windowing function to the output signal. The processing apparatus may therefore be further operative to apply a windowing function to the output signal. The windowing function may be of a length corresponding to plural cycles of the reference input signal. The windowing function may be configured to attenuate the amplitude of part of the output signal towards opposite ends of the window defined by the windowing function. More specifically the processing apparatus may operative to multiply the part of the output signal by the windowing function. The windowing function may be applied before determination of the at least one cumulative representation. Application of the windowing function may reduce the power within the at least one cumulative representation which may have a corresponding effect on the transfer function. The processing apparatus may therefore determine the transfer function further in dependence on a power function of the window to thereby compensate for reduction in power caused by application of the windowing function. The loss in power caused by application of the windowing function may be addressed by applying the windowing function to overlapping parts of the output signal. More specifically determination of the cumulative representation may comprise summing corresponding ones of plural received sections of the output signal which overlap with each other, the windowing function being applied to the overlapping received sections. For example a windowing function may be applied to a first part of the output signal and the windowing function may be applied to a second part of the output signal, with the first and second parts overlapping each other, such as by fifty percent. The windowing function may be predetermined, such as on the basis of pre-characterisation of the measurement arrangement, or may be determined on an ongoing basis, such as in dependence on analysis of the output signal. For example the window characteristics may be altered to take account of change in the output signal level or to trade-off a power loss of the window function against the windowing function's ability to reject the electrical output signal. In addition or alternatively the length of the window may be changed to improve upon rejection of the electrical output signal. For example the length of the windowing function may be aligned to a multiple of the length of the fundamental of the electrical output signal while maintaining the length as a multiple of the period of the reference input signal. In addition or alternatively an effective length of the window function may be variable such that there is an initial run in period where the rising edge of the window function is applied to an initial part of the output signal, followed by application of the windowing function as a constant, such as unity, until a result is needed when a falling edge of the windowing function is applied to a later part of the output signal. A variable length windowing function may confer the advantage of providing for management of windowing power loss on account of power being lost by way of application of the windowing function under controlled circumstances.

The amplitude of the reference input signal is normally much smaller than the amplitude of the electrical signal. This may present a particular challenge where the transfer function is to be determined to high accuracy. It may therefore be advantageous to remove as much as possible of the electrical output signal, which corresponds to the electrical signal, from the output signal before the step of summing plural sections of the output sections. The electrical measurement apparatus may therefore be configured to make a further measurement of the electrical signal, no reference input signal being applied during the further measurement, and to subtract the further measurement from the output signal. More specifically the electrical measurement apparatus may comprise a current sensor which is operative to measure the electrical signal and which receives no reference input signal whereby an output from the current sensor corresponds to the electrical signal. According to an approach the electrical measurement apparatus may comprise two current sensors with the reference input signal being applied to one current sensor only. The two current sensors may be disposed relative to different conductors, such as one current sensor disposed relative to the live conductor and the other current sensor disposed relative to the neutral conductor. Further features relating to subtraction of the further measurement from the output signal are described in WO 2013/038176 and in WO 2014/072733.

In certain circumstances it may be advantageous for a cycle rate of the reference input signal to be at a harmonic or sub-harmonic of a fundamental frequency of the electrical signal. In other circumstances it may be advantageous for a cycle rate of the reference input signal to be at other than a harmonic or sub-harmonic of a fundamental frequency of the electrical signal.

In certain applications the electrical output signal may be used. For example the electrical output signal may be used in metering applications. The reference output signal may therefore be removed from the output signal from the measurement arrangement before being used for the purpose, for example, of current or line voltage measurement followed by power consumption measurement. The processing apparatus may therefore be further operative to subtract the at least one cumulative representation from the output signal to thereby remove the reference output signal from the output signal. Although the transfer function may be determined in respect of less than a whole cycle of the reference input signal such that the like of rising and falling edge transitions are disregarded, the at least one cumulative representation as subtracted from the output signal may correspond to a whole cycle of the reference input signal. The processing apparatus may therefore be operative to remove the reference output signal properly despite at least one part of the reference output signal being disregarded for the purpose of transfer function determination.

The reference input signal has a substantially piecewise constant waveform. The reference input signal may therefore comprise a pulse waveform, such as a square wave, a bitstream having sections of highs and lows with different duty cycles, or a staircase or stepped waveform.

The processing apparatus may be further operative on cumulative representations on a selective basis. More specifically the processing apparatus may be operative to analyse the cumulative representations to identify at least one cumulative representation which comprises inappropriate characteristics. The analysis may comprise comparing cumulative representations and identifying at least one cumulative representation which deviates from other cumulative representations. A deviation may, for example, be caused by impulse noise. The processing apparatus may be further operative to disregard an identified cumulative representation or to be subject to filtering to reduce noise.

The processing apparatus may be further operative on the output signal when no reference input signal is applied. More specifically the processing apparatus may be operative to determine an extent of noise present in the output signal. The determined extent of noise may be used by the processing apparatus to provide an indication of accuracy and performance of the electrical measurement apparatus. The electrical measurement apparatus may be operative to apply no reference input signal to the electrical measurement apparatus on a periodic basis. For example no reference input signal may be applied for between 1% and 5% of a period of time when the electrical measurement apparatus is operating.

As mentioned above, the measurement arrangement may comprise a current sensor which is operative to measure the like of load drawn current in a conductor. The current sensor may be a shunt resistor, a current transformer, a Hall current probe or a Rogowski coil current probe.

The electrical signal may be a load drawn current signal. The load drawn current signal may be at least 0.1 Amp peak or RMS. More specifically the load drawn current signal may be at least 1 Amp peak or RMS, 5 Amps peak or RMS, 10 Amps peak or RMS, 20 Amps peak or RMS, 40 Amps peak or RMS, 80 Amps peak or RMS, 100 Amps peak or RMS, 200 Amps peak or RMS or 320 Amps peak or RMS.

As mentioned above, the measurement arrangement may comprise a potential attenuator that is operative to measure the like of line voltage between two conductors. The potential attenuator may be formed by means of a passive resistive divider or by means of a suitably arranged active attenuator.

The electrical signal may be a line voltage of a mains supply. The line voltage may be at least 70 V RMS. More specifically the line voltage may be at least 70V RMS for a 110V system and 160V RMS for a 230V system. The line voltage may be higher for medium and high voltage transmission systems or across phases in multiphase systems.

Where the electrical signal is a mains alternating current or voltage, the fundamental frequency of the alternating current may be less than 500 Hz, such as a frequency of substantially 60 Hz or substantially 50 Hz for domestic mains or a frequency of substantially 400 Hz for mains in ships or aircraft. Alternatively or in addition a frequency of the reference input signal may be less than 250 kHz, 100 kHz, 50 kHz, 20 kHz, 10 kHz, 5 kHz, 2.5 kHz or 1.25 kHz, 625 Hz, 320 Hz, 160 Hz, 80 Hz or less than the fundamental of either the load drawn current or the line voltage.

Where the electrical signal is a current flowing in a DC powered system it may still have a fundamental frequency on account of operation of the load, such as a switching power supply, a DC motor, an H-bridge or the like. The fundamental frequency in this case may be less than 1 kHz, less than 10 kHz or less than 100 kHz.

The electrical signal may be a voltage in a DC system, such as voltage across a battery, a battery cell or a solar cell, provided by a DC/DC or AC/DC power supply or the like. The voltage may be at least 3 Volts peak. More specifically the voltage may be at least 5V peak, 10V peak, 20V peak, 40V peak or 80V peak. The voltage may change significantly and in respect of frequency content when apparatus is loaded or charged. There may be a fundamental frequency of operation in different modes of operation. Such a fundamental frequency of operation may be at least 1 Hz, 100 Hz or 10 kHz.

Where the electrical signal is present in apparatus supplied from a multi-phase mains electricity supply, according to a second aspect of the present invention there may be provided measuring apparatus comprising at least one electrical measurement apparatus according to the first aspect of the present invention, the at least one electrical measurement apparatus being configured to measure an electrical signal in each of different conductors of the electrical supply. For example the multi-phase mains electricity supply may be a split-phase supply, a three phase supply or even a supply with more than three phases. The at least one electrical measurement apparatus may comprise plural measurement arrangements configured to be disposed relative to different conductors of the electricity supply. In addition the at least one electrical measurement apparatus may comprise a signal source and processing apparatus which are multiplexed between different conductors. Alternatively the at least one electrical measurement apparatus may comprise plural signal sources and processing apparatus which are each operative to apply reference input signals and to process measurement arrangement output signals in respect of different conductors. Further embodiments of the second aspect of the invention may comprise one or more features of the first aspect of the invention.

According to a third aspect of the present invention there is provided an electrical measurement method comprising:
applying a reference input signal by way of a signal source to a measurement arrangement disposed in relation to an electrical circuit which bears an electrical signal, the measurement arrangement being operative when so disposed to measure the electrical signal;
receiving an output signal from the measurement arrangement in processing apparatus, the output signal comprising an electrical output signal corresponding to the electrical signal and a reference output signal corresponding to the reference input signal, the reference input signal having a substantially piecewise constant form which is repeated over each of plural cycles;
determining at least one cumulative representation, determination of the cumulative representation comprising summing plural received sections of the output signal, each of the plural received sections corresponding to at least a part and to a same part of the cycle of the reference input signal; and
determining at least one of: a transfer function for the measurement arrangement; a change in a transfer function for the measurement arrangement; and the electrical signal, in dependence on the at least one cumulative representation and the reference input signal.

Embodiments of the third aspect of the present invention may comprise one or more features of the first aspect of the present invention.

According to a fourth aspect of the present invention there is provided electrical apparatus comprising electrical measurement apparatus according to the first aspect of the present invention or measuring apparatus according to the second aspect of the present invention, the electrical apparatus being configured such that the electrical measurement apparatus or measuring apparatus measures an electrical signal present in a part of the electrical apparatus. The present invention according to the first, second or fourth aspect may be configured to be operative with an arrangement in which a load draws an AC or DC current signal. The electrical apparatus may comprise DC apparatus, such as an electric battery and a battery charger, and the current measurement apparatus may be configured to measure at least one of a current sourced by the DC apparatus and a current sunk by the DC apparatus. The electrical apparatus may comprise AC apparatus and the current measurement apparatus may be configured to measure at least one of a current sourced by the AC apparatus and a current sunk by the AC apparatus. The present invention according to the first, second or fourth aspect may be configured to be operative with an arrangement supplied by an AC source, such as a mains electricity supply, an inverter or the like, or supplied by a DC source such as an AC/DC power supply, an electric battery, a dynamo or the like.

Alternatively or in addition the electrical apparatus may comprise electricity storage, generation, transmission or distribution apparatus. Where the electrical apparatus comprises electricity storage apparatus the electrical apparatus may comprise an electric battery. The electrical apparatus may, for example, be constituted by an electricity meter or a distribution box with the electrical measurement apparatus being operative to measure current passing through or line voltage in the electricity meter or distribution box. The electrical measurement apparatus may thereby provide a means to measure the electricity consumed by a residence, business or electrically powered device or generated by generation apparatus, such as a solar panel based generator. Alternatively or in addition the electrical apparatus may comprise electrical propulsion apparatus comprising an electrical energy storage or generation device, such as a battery or fuel cell. The electrical propulsion apparatus may be configured such that the electrical measurement apparatus is operative to provide for regulation, e.g. by measurement of direct current, of at least one of: power sourced by the electrical energy storage or generation device; and power sunk by the electrical energy storage device, e.g. during charging. Safe and reliable delivery of electrical power to electric motors at high current levels is normally required of such electrical propulsion apparatus. Accurate electrical measurement may therefore be required to provide for proper regulation and control and to monitor for fault conditions. Alternatively or in addition the electrical apparatus may comprise electrical control apparatus comprising an electrical actuator. The electrical control apparatus may be configured such that the electrical measurement apparatus is operative to measure current drawn by the electrical actuator and/or voltage supported by electrical actuator. The electrical actuator may comprise a motor and the electrical measurement apparatus may be comprised in a motor controller which is operative to control the motor. Electrical control apparatus may be used in diverse fields, such as manufacturing, commercial machinery and process control. For example the electrical actuator may comprise a stepper motor forming part of a CNC machine or driving a valve in a fluid control system. Alternatively the electrical actuator may comprise a linear solenoid in an electrically controlled automotive transmission system. In such applications accurate measurement of current and/or voltage may provide for precision of control. Further embodiments of the fourth aspect of the present invention may comprise one or more features of any previous aspect of the present invention.

BRIEF DESCRIPTION OF DRAWINGS

Further features and advantages of the present invention will become apparent from the following specific description, which is given by way of example only and with reference to the accompanying drawings, in which.

DESCRIPTION OF EMBODIMENTS

Figure 1:
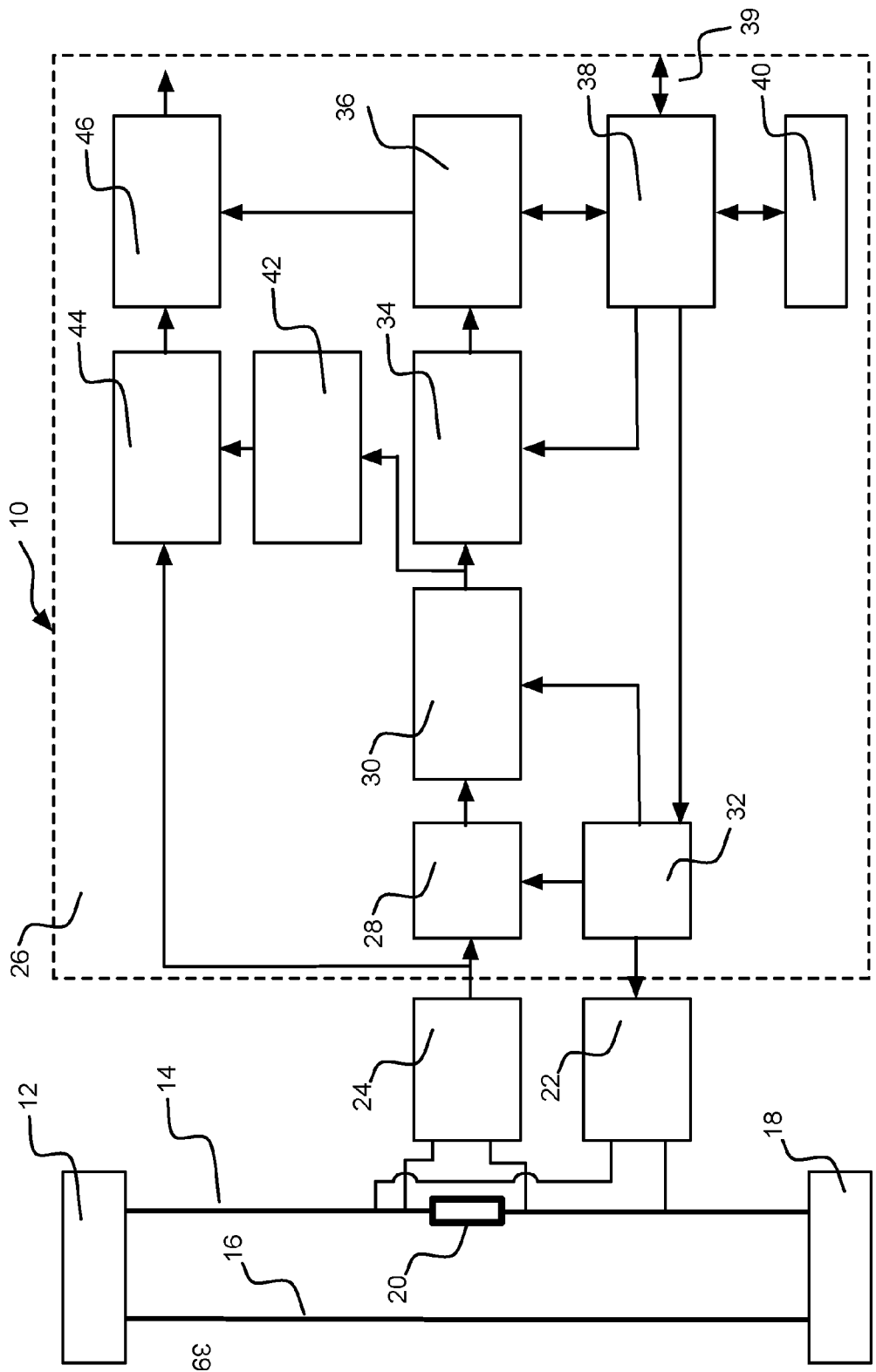
FIG. 1 is a block diagram representation of a first embodiment of the present invention.

A block diagram representation of a first embodiment of electrical measurement apparatus is shown in FIG. 1. The electrical measurement apparatus has the form of current measurement apparatus 10 which forms part of the like of a 100 A capable electricity consumption meter (not shown) installed at a point of supply to residential or business premises. A single phase mains alternating current electricity source 12 with live 14 and neutral 16 supply wires are shown in FIG. 1. Energy consuming apparatus at the residential or business premises is represented by a load 18. The current measurement apparatus 10 comprises a shunt resistor 20 (which constitutes a current sensor) in the live supply wire 14 in series with the load 18 between the load and the electricity supply 12. The shunt resistor 20 presents a low value of resistance, such as a resistance of 200 u$\Omega$. The shunt resistor 20 is formed from a length of electrical wire, a length of conductive track on a printed circuit board, a discrete component, a conductor comprised in an integrated circuit package such as a lead frame or a structure formed as part of a connector or conductive element of a series component such as a relay. As is described in WO 2013/038176 the shunt resistor need not be formed to provide an accurate or stable resistance; nor need the processing chain for the shunt resistor be accurately characterised. A current transformer, a Hall current probe or a Rogowski coil current probe may be used to sense current in the live conductor instead of the shunt resistor 20. The use of such alternative forms of current sensor and appropriate processing circuitry is described in WO 2013/038176.

The current measurement apparatus 10 further comprises a signal source 22, voltage measuring apparatus 24 and signal processing circuitry 26. The voltage measuring apparatus 24 comprises programmable gain amplifier and analogue to digital conversion circuitry which is operative to acquire a voltage signal developed across the shunt resistor 20 and to generate a corresponding acquired voltage signal. The shunt resistor 20 and the voltage measuring apparatus 24 constitute a measurement arrangement and the signal processing circuitry 26 constitutes processing apparatus. The signal processing circuitry 26 is comprised in a microprocessor arrangement, digital signal processor arrangement or the like. Although not shown in FIG. 1 the current measurement apparatus comprises a noise filter at the input of the voltage measuring apparatus 24 to suppress undesirable noise signals, such as impulse signals, which might otherwise be liable to disrupt operation of the current measurement apparatus. Each of the voltage measuring apparatus 24 and the signal source 22 is electrically connected to opposite ends of the shunt resistor 20. In one form the current measurement apparatus 10 is constituted such that the signal source 22 is always present with the rest of the current measurement apparatus 10 such that the signal source and the rest of the current measurement apparatus 10 is permanently in situ. In another form the current measurement apparatus 10 is constituted such that the signal source is comprised in a separate unit from the rest of the current measurement apparatus 10, which is permanently in situ. When it is desired to provide for accurate measurement, e.g. as part of a periodic calibration procedure, the unit comprising the signal source 22 is brought into use, for example by a calibration engineer, and connected across the shunt resistor 20 before calibration begins. Approaches to calibration applicable to the current measurement apparatus of FIG. 1 are described in WO 2013/038176.

The components of the signal processing circuitry 26 will now be considered. The signal processing circuitry 26 comprises a windowing component 28, which is operative to apply a windowing function to the output signal from the voltage measuring apparatus 24. The windowing function applied by the windowing component 28 is one or more of a Hanning function, a Hamming function, a Blackman function, a Gaussian function and a rectangular function amongst others. The windowing function is either predetermined, such as on the basis of pre-characterisation of the measurement arrangement, or is determined on an ongoing basis, such as in dependence on analysis of the output signal from the voltage measuring apparatus 24. The window function is altered in dependence on an amplitude of the electrical output signal. Also the length of the window is altered in dependence on the fundamental frequency of the load drawn current signal and the cycle period of the reference input signal. The windowing function is of variable length such that there is a period of constant gain between the rising edge and the falling edge of the windowing function until a result is required. The signal processing circuitry 26 also comprises a summing component 30 which is operative as described further below to sum sections of the output signal received from the windowing component 28. The operation of the signal source 22, the windowing component 28 and the summing component 30 is synchronised by way of timing signals generated by a timing component 32 comprised in the signal processing circuitry 26 as is described further below. The signal processing circuitry 26 further comprises a level determining component 34 which receives an output from the summing component 30 and a transfer function determining component 36 which receives an output from the level determining component 34. The signal processing circuitry 26 yet further comprises a control component 38, such as a central processing unit, which is operative to control various other components of the signal processing circuitry 26 including the timing component 32, the level determining component 34 and the transfer function determining component 36. The control component 38 also provides external data by way of a data output 39 in dependence on operation of the current measurement apparatus 10 with such external data including the like of alerts and control data which is acted upon by other apparatus. Forms of external data and the means by which such data is conveyed away from the current measurement apparatus 10 are described further in WO 2013/038176. Electronic memory 40 comprised in signal processing circuitry 26 is operative to store intermediate data formed during computations performed by the signal processing circuitry 26 along with less impermanent data such as transfer function data of an historic nature determined by the signal processing circuitry. The electronic memory 40 is also operative to store data determined on initial test such as the value of the reference input signal, which is stored in a One Time Programmable form of memory. The signal processing circuitry 26 yet further comprises a waveform reconstruction component 42 which receives an output from the summing component 30, a waveform removal component 44 which receives an output from each of the waveform reconstruction component 42 and the voltage measuring apparatus 24, and a load current determining component 46 which receives an output from the waveform removal component 44.

In other un-illustrated embodiments the source 12 is a DC source and the load 18 draws current from the DC source. Such embodiments are used in various applications, such as regulation or monitoring, and are comprised in diverse apparatus, such as energy generation, transmission or distribution apparatus, renewable energy generators, electrical propulsion apparatus and control apparatus. In further un-illustrated embodiments, the current measurement apparatus is used for measuring current in multi-phase mains electricity supply arrangements such as a split-phase supply arrangement, a three phase supply arrangement or even a supply arrangement with more than three phases. According to such further embodiments plural current measurement apparatus of the form shown in FIG. 1 are used to measure current in respective different conductors of the multi-phase mains electricity supply arrangement. Alternatively plural current sensors are disposed in relation to respective different conductors of the multi-phase mains electricity supply arrangement and the rest of the current measurement apparatus of FIG. 1 is multiplexed between the plural current sensors. Application of current measurement apparatus to DC current measurement and in multi-phase mains electricity supply arrangements is described further in WO 2013/038176. DC current measurement is, for example, performed in electrical apparatus comprising an electric battery, such as propulsion apparatus.

Figure 2:
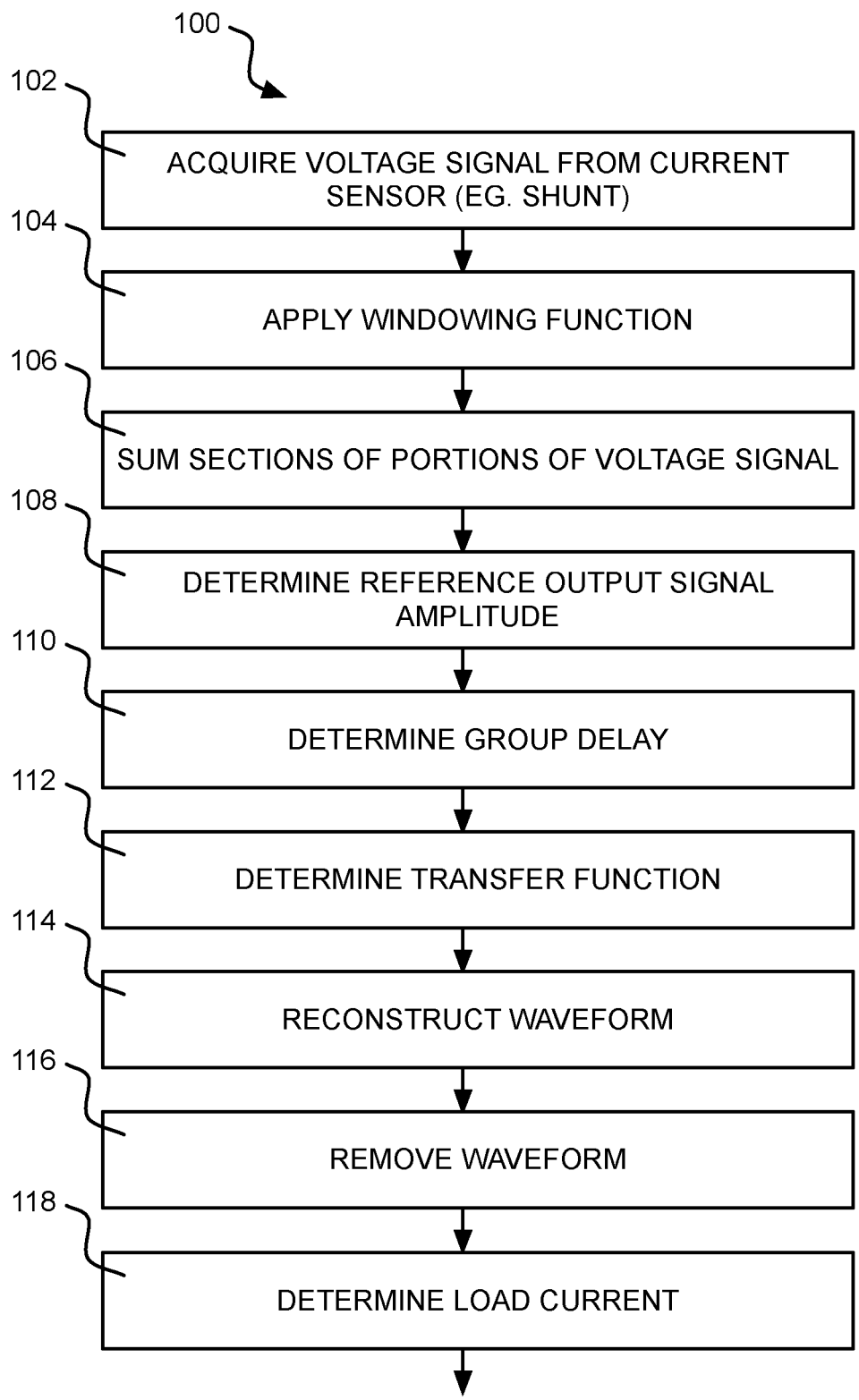
FIG. 2 is a flow chart representation of a method according to the invention performed by way of the embodiment of FIG. 1.
Figure 3A:
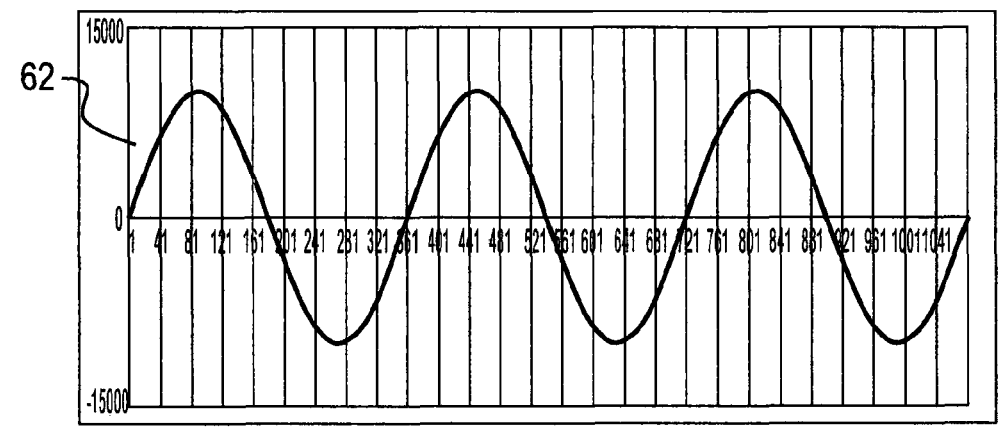
FIG. 3A is a plot representing the application of a windowing function.
Figure 3A:
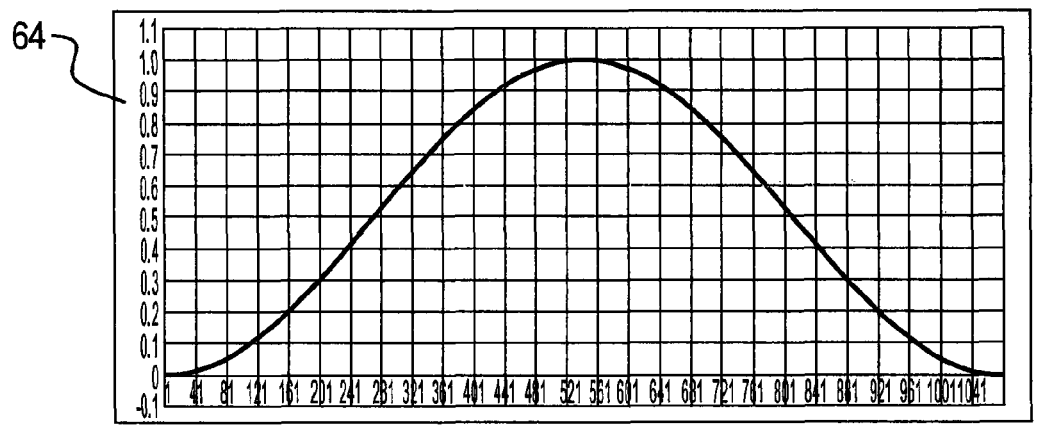
Figure 3A:
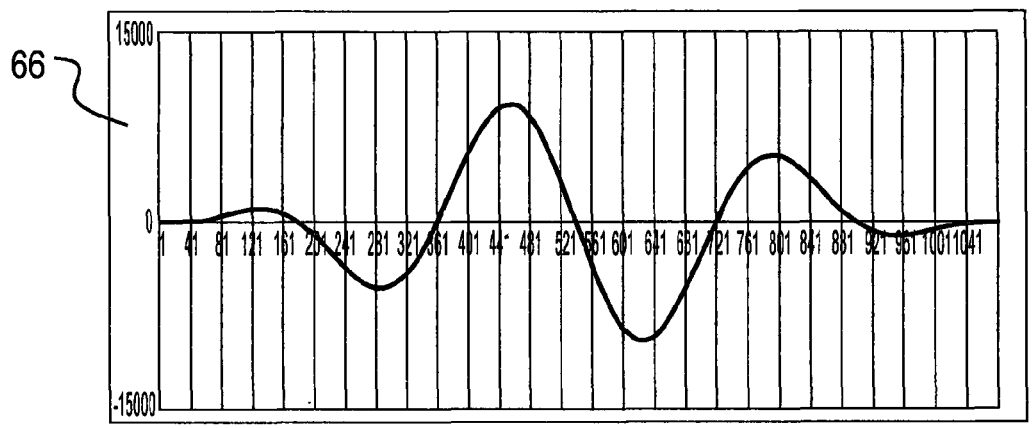
Figure 3B:
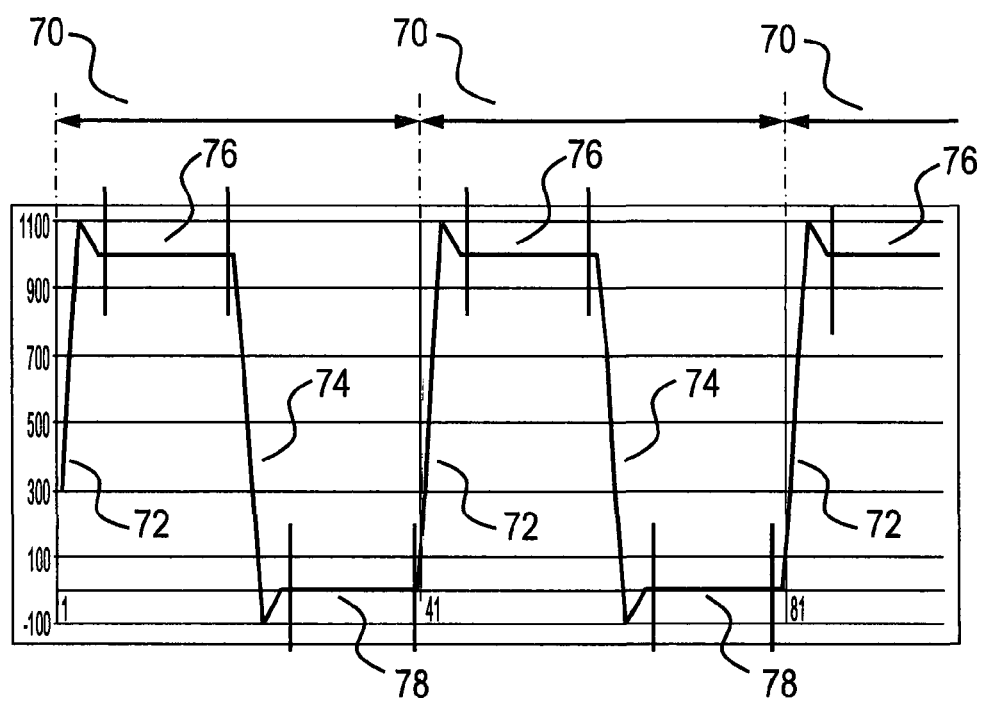
FIG. 3B is a plot showing several cycles of an output signal from the measurement arrangement.

The operation of the current measurement apparatus 10 of FIG. 1 will now be described with reference to the flow chart 100 shown in FIG. 2 and the plots shown in FIGS. 3A and 3B. The signal source 22 is configured to apply a reference input signal to the shunt resistor 20 under the control of the timing component 32. The reference input signal has a repeating cycle in the range of a few hertz to a few tens of kHz. The reference input signal has a frequency largely between harmonics of the fundamental frequency of the load current signal. Alternatively the reference input signal frequency is locked to a harmonic of the fundamental frequency of the load current signal. The reference input signal is of substantially piecewise constant form such as a square wave, a bitstream having sections of highs and lows with different duty cycles, or a staircase or stepped waveform. A typical reference input signal is 30 mA peak to peak. The applied reference input signal is sensed by the shunt resistor 20 along with the load drawn current signal which in the present embodiment is a 50 Hz mains current signal. The voltage measuring apparatus 24 is operative to acquire voltage signals developed across the shunt resistor 20 and to generate acquired voltage signals (which constitute output signals) 102. An acquired voltage signal comprises an electrical output signal corresponding to the load drawn current signal and a reference output signal corresponding to the reference input signal. The acquired voltage signal is received by the windowing component 28 which is operative to multiply the acquired voltage signal by the windowing function 104. The windowing function is of a length corresponding to plural cycles of the reference input signal, such as two hundred cycles. The windowing function is operative to attenuate the amplitude of part of the acquired voltage signal towards opposite ends of the window defined by the windowing function and thereby provide for improved rejection of the reference output signal during the subsequent summing operation. FIG. 3A shows a length of acquired voltage signal 62, a windowing function 64 and the length of acquired voltage signal after application of the windowing function 66. The application of the windowing function is liable to cause a loss in power from the output signal. In certain forms of the embodiment loss of power is addressed by applying the windowing function to overlapping parts of the output signal. This involves applying the windowing function to a first length of the acquired voltage signal and applying the windowing function to a second length of the acquired voltage signal, with the first and second lengths overlapping each other to an extent sufficient to minimise the power loss. In certain forms of the invention such overlapping streams of acquired voltage signal data are partially processed as described above with reference to one stream of data before being subsequently combined. For example the summing operation is performed separately on each stream and their levels determined separately. Alternatively the overlapping streams are processed together by summing the streams together. Application of the windowing function is under the control of the timing component 32 to provide for synchronisation of application of the windowing function to the acquired voltage signal with cycles of the reference input signal as applied by the signal source 22.

Thereafter the windowed length of voltage signal is received by the summing component 30 which is operative to decompose the length of voltage signal into plural portions with each portion corresponding to a cycle of the reference input signal. Where, for example, the voltage signal has a length of two hundred cycles the length of voltage signal is decomposed into two hundred portions. The summing component 30 then operative to sum sections of the two hundred portions, with each of the summed sections corresponding to at least a part and to a same part of the cycle of the reference input signal 106. The summing operation and the subsequent level determining operation within the level determining component 34 are carried in accordance with several different approaches.

According to a first approach the entire portions of the voltage signal are summed to provide a cumulative representation. Summing the portions in this fashion removes the electrical output signal on account of the electrical output signal being of a different period to the reference output signal or of changing phase with respect to the reference output signal. The cumulative representation is then divided by the number of summed portions to provide a representation of amplitude commensurate with the reference input signal. Alternatively division by the number of summed portions takes place at a later step in the present approach. A typical voltage signal comprises parts consisting of a slow rise or fall following each transition of the piecewise constant waveform followed perhaps by ringing. An example voltage signal of a length corresponding to several cycles 70 of the reference input signal is shown in FIG. 3B. The voltage signal comprises rising parts 72, falling parts 74, high levels 76 and low levels 78. The summing component 30 is therefore operative to exclude such rising and falling parts and to select the generally settled parts of the voltage signal. The rising and falling parts are excluded following analysis of the voltage signal involving comparison of the rate of change of the voltage signal with a threshold value. Alternatively rising and falling parts are excluded on the basis of pre-characterisation of the measurement arrangement which determines the rising and falling parts to be of a certain length following a transition in the reference input signal. Parts of corresponding level in the cumulative representation are then summed. For example and where the reference input signal is a square wave the high levels are all summed and the low levels are all summed to provide a summed high level and a summed low level respectively. The summed high level and the summed low level are then divided by the number of summed levels to provide an average high level and an average low level. Alternatively and similar to the division following the formation of the cumulative representation the division takes place later in the present approach. Irrespective of whether division is in the summing component or subsequently the effect is to provide an average level. Then the summed or average low is subtracted in the level determining component 34 from the summed or average high to provide a reference output signal amplitude 108.

According to a second approach the summing component is operative to sum parts of corresponding level in the portions of the voltage signal to provide two cumulative representations. For example the summing component is operative to sum all the high levels in the portions to provide a summed high level and to sum all the low levels in the portions to provide a summed low level. The rising and falling parts are excluded from the summing operations as described above with reference to the first approach. The summed high and low levels are then divided by the number of summed levels to provide average levels. Alternatively the division takes place after the following subtraction step. Then the summed low level or average summed low level is subtracted in the level determining component 34 from the summed high level or average summed low level to provide a reference output signal amplitude 108.

According to a third approach the summing component is operative to provide a reference output signal amplitude, which constitutes a cumulative representation, by summing the selected high levels and subtracting the selected low levels on an ongoing basis as the voltage signal is received 108. The operations of the summing component 30 and the level determining component 34 are thus combined. As described above the reference output signal is divided by the number of summed levels. Alternatively the division takes place earlier in the approach, such as in respect of each level before it is either summed or subtracted.

The reference output signal amplitude is received by the transfer function determining component 36 which is operative to determine a transfer function in respect of the gain of the measurement arrangement by dividing the reference output signal amplitude by the amplitude of the reference input signal 112. In certain forms the transfer function determining component 36 is also operative to determine a group delay for the measurement arrangement by determining a time delay between an edge in the reference input signal and the corresponding edge in the reference output signal as represented by the acquired voltage signal 110. Where the windowing function causes loss of power from the reference output signal amplitude the transfer function determining component 36 is operative to compensate for such loss of power.

The current measurement apparatus is operative such that the waveform reconstruction component 42 receives an input from the summing component 30. The waveform reconstruction component 42 is operative to provide a cumulative representation of a length of the voltage signal corresponding to a complete cycle of the reference input signal, i.e. a complete cumulative representation 114. Operation of the waveform reconstruction component 42 depends on operation of the summing component 30. Where the summing component 30 is operative according to the first approach the cumulative representation formed by summing entire portions of the voltage signal is already complete and is thus provided to the waveform reconstruction component 42 and no reconstruction is required. Where the summing component 30 is operative according to the second or third approach the waveform reconstruction component 42 is operative to form a complete cumulative representation from the different levels used to determine the reference output signal amplitude and the disregarded rising and falling parts. The complete cumulative representation is scaled to compensate for operations performed prior to formation of the complete cumulative representation, such as summing and windowing operations, whereby the complete cumulative representation corresponds to the acquired voltage signal from which it is subtracted in the waveform removal component 44 as described below.

Figure 3C:
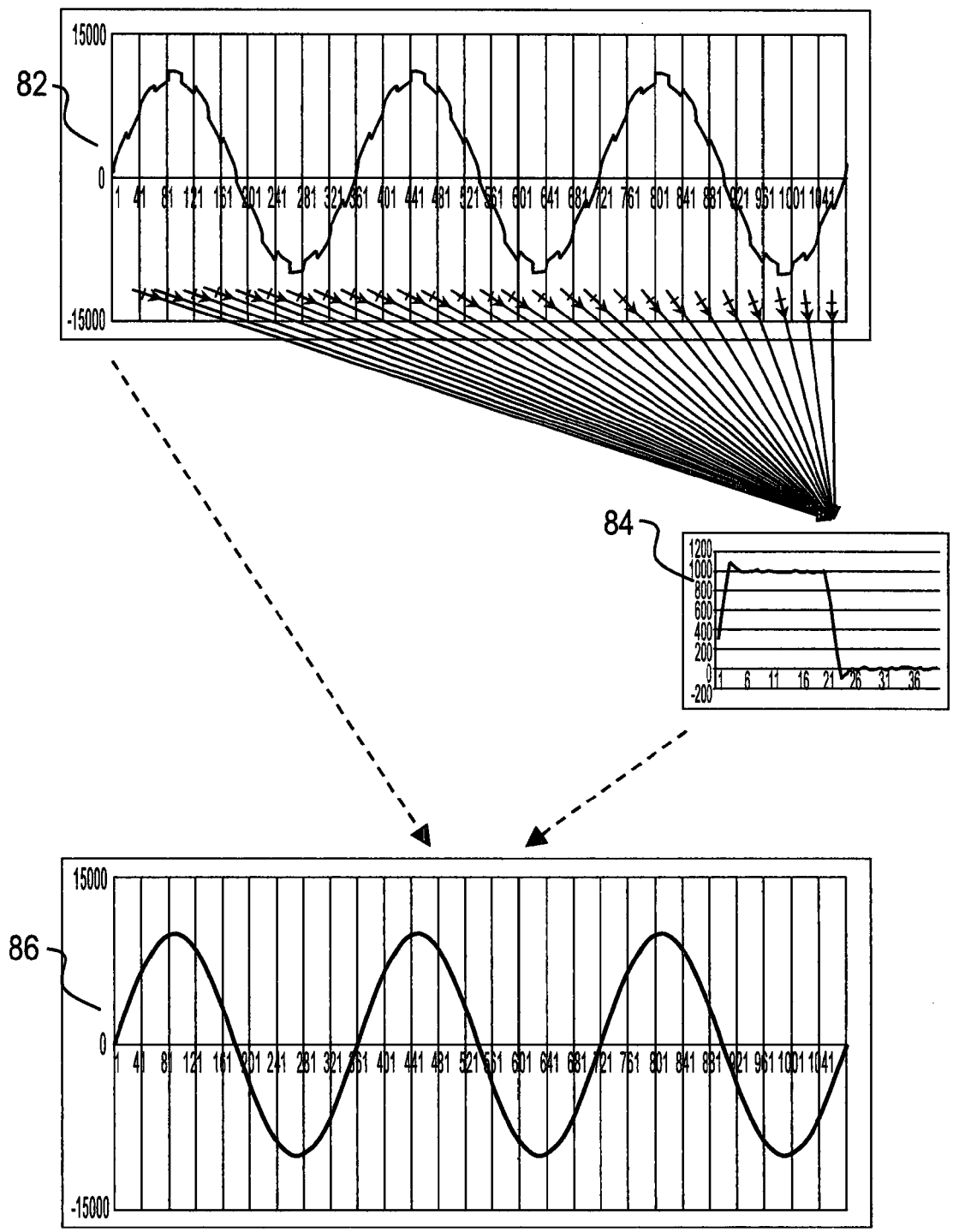
FIG. 3C is a plot which illustrates the waveform removal process.

FIG. 3C is a plot which illustrates operation of the waveform removal component 44. The waveform removal component 44 receives an input from the voltage measuring apparatus 24, 82 and the complete cumulative representation 84 from the waveform reconstruction component 42 and is operative to subtract the complete cumulative representation, which corresponds to the reference output signal, from the acquired voltage signal to leave the electrical output signal comprised in the acquired voltage signal 116, 86. The load current determining component 46 receives the output from the waveform removal component 44 and the transfer function from the transfer function determining component 36 and is operative to determine the load drawn current by applying the inverse of the received transfer function to the output from the waveform removal component 44, 118. The determined load drawn current is then provided by the load current determining component 46 for application elsewhere, such as in determination of power consumption or the like as described in detail in WO 2013/038176.

Further to the operations described above the control component 38 provides for rejection of parts of the acquired voltage signal where such rejected parts comprise impulse noise of an extent that would prejudice proper operation of the current measurement apparatus. The control component 38 also provides for determination of the level of noise present in the acquired voltage signal by analysing the acquired voltage signal when no reference input signal is applied to the shunt resistor 20. The control component 38 is further operative to provide an indication of accuracy of current measurement in dependence on the determined level of noise.

Figure 4:
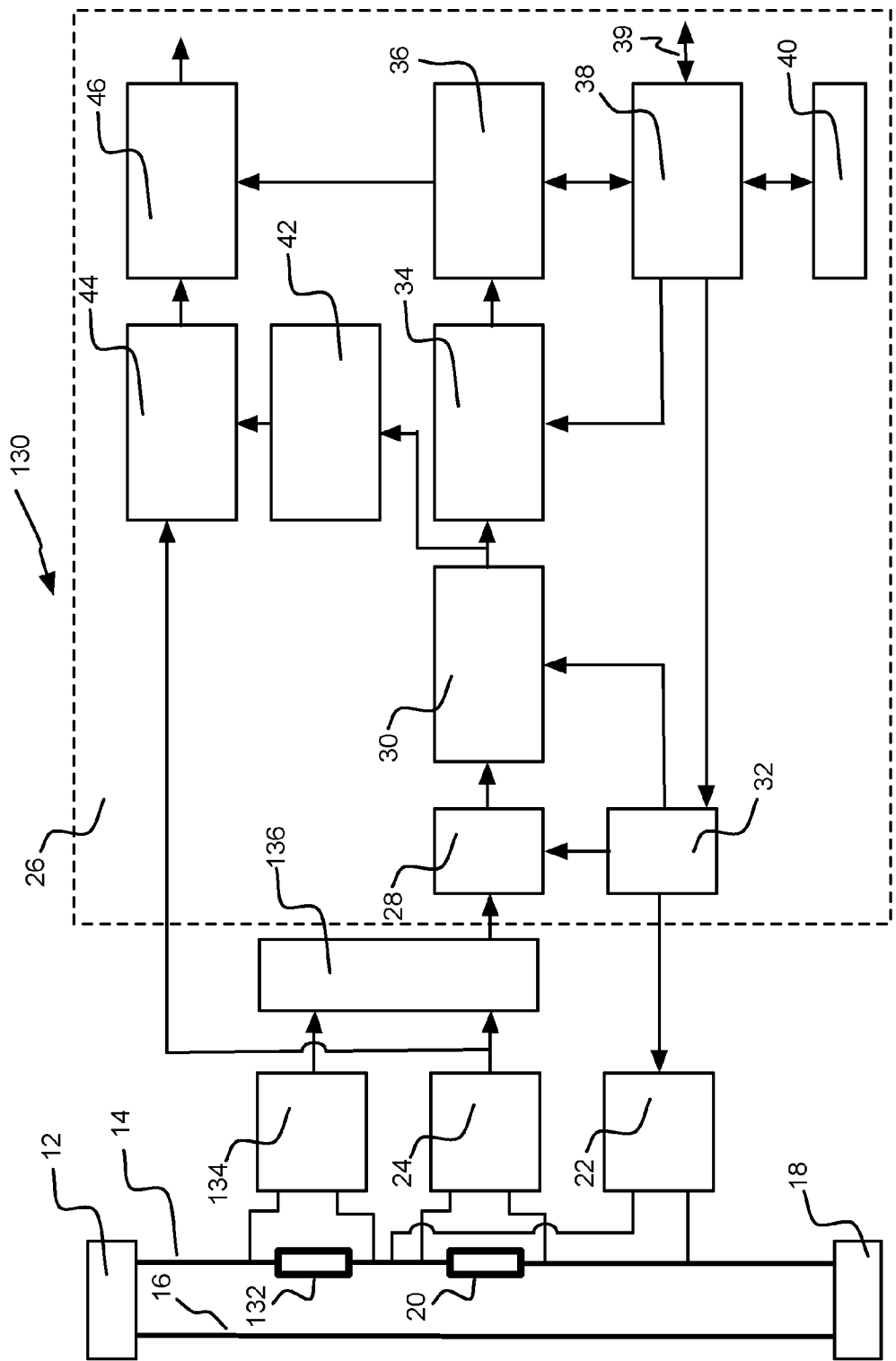
FIG. 4 is a block diagram representation of a second embodiment of the present invention.

A block diagram representation of a second embodiment of the present invention 130 is shown in FIG. 4. Components of the current measurement apparatus 130 of FIG. 4 in common with FIG. 1 are designated with like reference numbers and the reader's attention is directed to the description provided above with reference to FIG. 1 for a description of such common components. The current measurement apparatus 130 of FIG. 4 further comprises a second shunt resistor 132 and a second voltage measuring apparatus 134. No reference input signal is applied to the second shunt resistor 132 whereby the output signal from second voltage measuring apparatus 134 comprises the electrical output signal but lacks the reference output signal. The current measurement apparatus 130 yet further comprises a subtraction component 136 which is operative to subtract the output signal from the second voltage measuring apparatus 134 from the output signal from the first voltage measuring apparatus 24. The subtraction component 136 also performs relative scaling of the received output signals to provide for proper subtraction of the output signals if required. The output from the subtraction component 136 has a much reduced component corresponding to the load drawn current signal. The waveform removal component 44 is operative on the output signal from the first voltage measuring apparatus 24 and not the output signal from the second voltage measuring apparatus 134. The configuration of FIG. 4 may be used to effect when the applied reference input signal is much smaller than the load drawn current signal as is often the case. Subtraction of the electrical output signal according to the embodiment of FIG. 4 is described in further detail in WO 2013/038176 in respect of different approaches to subtraction of the electrical output signal.

Figure 5:
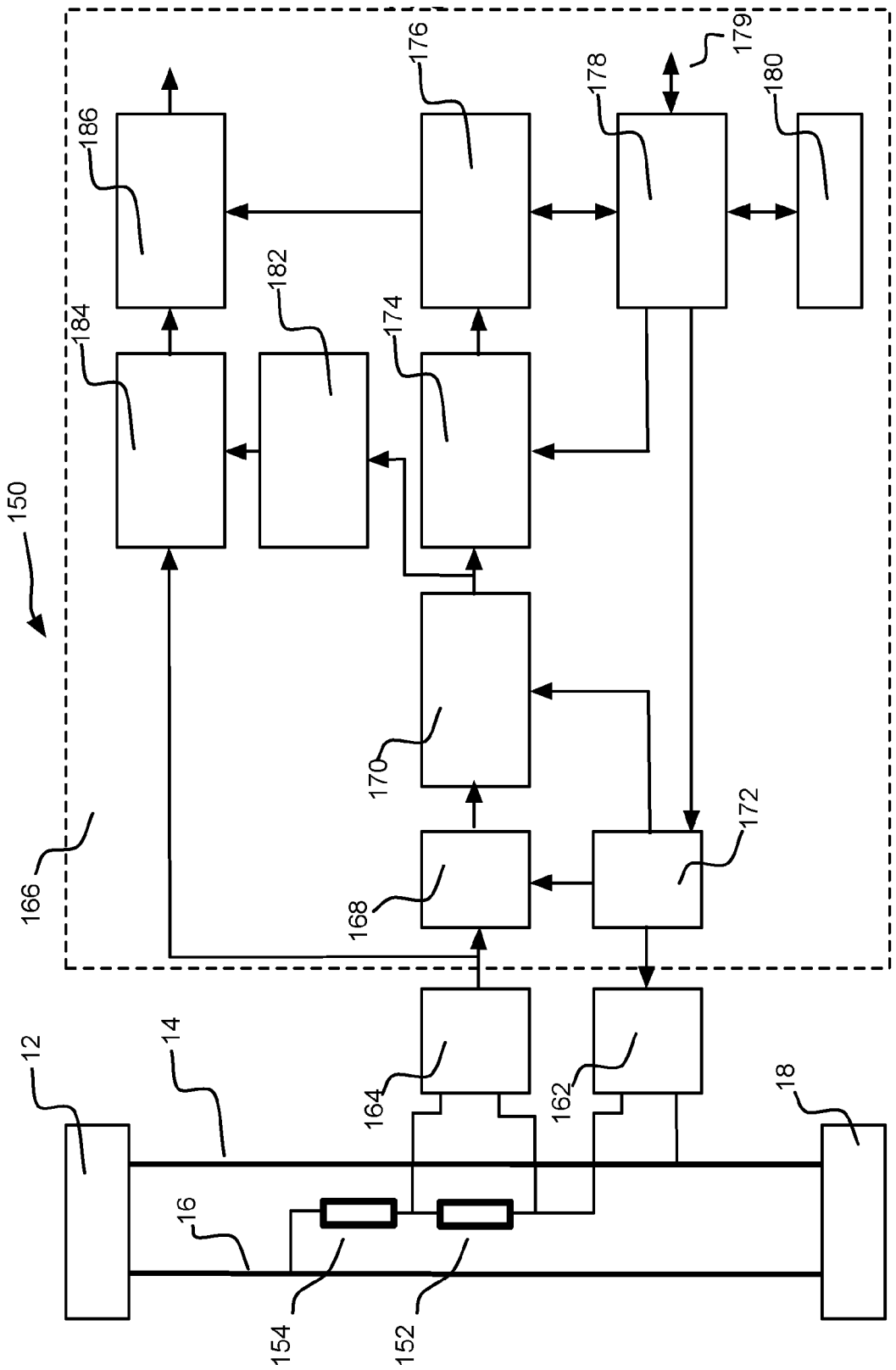
FIG. 5 is a block diagram of a third embodiment of the present invention.

A block diagram representation of a third embodiment of electrical measurement apparatus is shown in FIG. 5. The electrical measurement apparatus has the form of voltage measurement apparatus 150 which is configured to measure the line voltage between the live and the neutral conductor of an AC system. The electrical measurement apparatus 150 forms part of the like of a 100 A capable electricity consumption meter (not shown) installed at a point of supply to residential or business premises. A single phase mains alternating current electricity source 12 with live 14 and neutral 16 supply wires are shown in FIG. 5. Energy consuming apparatus at the residential or business premises is represented by a load 18. The electrical measurement apparatus 150 comprises a first resistor 154 in series with a second resistor 152 (which together constitute a potential attenuator) between the live conductor 14 the neutral conductor 16. The electrical measurement apparatus 150 further comprises a signal source 162 that is capable of providing a changing offset voltage to the potential attenuator; operation of the signal source 162 is described below. The first resistor 154 normally has a resistance value which is orders of magnitude larger than the resistance value of the second resistor 152 to thereby provide for measurement of line voltage of the order of 110V, 230V or the like. The first resistor 154 is constructed differently or out of several components in series to thereby manage its resistance value relative to the resistance value of the second resistor 152. As described in WO 2014/072733 the first and second resistors need not be chosen or constructed to provide an accurate or stable potential attenuator; nor need the processing chain for the potential attenuator be accurately characterised. Alternative forms of potential attenuator and signal source are described in WO 2014/072733.

The electrical measurement apparatus 150 of FIG. 5 further comprises voltage measuring apparatus 164 and signal processing circuitry 166. The voltage measuring apparatus 164 comprises a programmable gain amplifier and analogue to digital conversion circuitry, which is operative to acquire a voltage signal developed across the second resistor 152 and to generate a corresponding acquired voltage signal. The potential attenuator formed by the first and second resistors 154, 152 and the voltage measuring apparatus 164 together constitute a measurement arrangement and the signal processing circuitry 166 constitutes processing apparatus. The signal processing circuitry 166 is comprised in a microprocessor arrangement, digital signal processor arrangement or the like. Although not shown in FIG. 5 the electrical measurement apparatus 150 comprises a noise filter at the input of the voltage measuring apparatus 164 to suppress undesirable noise signals, such as impulse signals, which might otherwise be liable to disrupt operation of the electrical measurement apparatus. The signal source 162 is configured to generate an offset voltage. The signal source 162 generate an offset voltage by switching between different voltage levels or by other means of modulating between different voltage levels to generate a reference input signal in series with the potential attenuator. Approaches to calibration applicable to the electrical measurement apparatus of FIG. 5 are described in WO 2014/072733.

The components of the signal processing circuitry 166 will now be considered. The signal processing circuitry 166 comprises a windowing component 168 which is operative to apply a windowing function to the output signal from the voltage measuring apparatus 164. The windowing function applied by the windowing component 168 is one or more of a Hanning function, a Hamming function, a Blackman function, a Gaussian function and a rectangular function amongst others. The windowing function is either predetermined, such as on the basis of pre-characterisation of the measurement arrangement, or is determined on an ongoing basis, such as in dependence on analysis of the output signal from the voltage measuring apparatus 164. The windowing function is altered in dependence on an amplitude of the output signal from the voltage measuring apparatus 164. Also the length of the window is altered in dependence on the fundamental frequency of the line voltage signal and the cycle period of the reference input signal. The windowing function is of variable length such that there is a period of constant gain between the rising edge and the falling edge of the windowing function until a measurement is required. The signal processing circuitry 166 also comprises a summing component 170 which is operative as described further below to sum sections of the output signal received from the windowing component 168. The operation of the signal source 162, the windowing component 168 and the summing component 170 is synchronised by way of timing signals generated by a timing component 172 comprised in the signal processing circuitry 166 as is described further below. The signal processing circuitry 166 further comprises a level determining component 174 which receives an output from the summing component 170 and a transfer function determining component 176 which receives an output from the level determining component 174. The signal processing circuitry 166 yet further comprises a control component 178, such as a central processing unit, which is operative to control various other components of the signal processing circuitry 166 including the timing component 172, the level determining component 174 and the transfer function determining component 176. The control component 178 also provides external data by way of a data output 179 in dependence on operation of the electrical measurement apparatus 150 with such external data including the like of alerts and control data which is acted upon by other apparatus. Forms of external data and the means by which such data is conveyed away from the electrical measurement apparatus 150 are described further in WO 2014/072733. Electronic memory 180 comprised in the signal processing circuitry 166 is operative to store intermediate data formed during computations performed by the signal processing circuitry 166 along with less impermanent data such as transfer function data of an historic nature determined by the signal processing circuitry. The electronic memory 180 is also operative to store data determined on initial test such as the value of the reference input signal, which is stored in a One Time Programmable form of memory. The signal processing circuitry 166 yet further comprises a waveform reconstruction component 182 which receives an output from the summing component 170, a waveform removal component 184 which receives an output from each of the waveform reconstruction component 182 and the voltage measuring apparatus 164, and a line voltage determining component 186 which receives an output from the waveform removal component 184.

In other un-illustrated embodiments the source 12 is a DC source and the load 18 draws current from the DC source. Such embodiments are used in various applications, such as regulation or monitoring, and are comprised in diverse apparatus, such as energy generation, transmission or distribution apparatus, renewable energy generators, electrical propulsion apparatus and control apparatus. In further un-illustrated embodiments, the electrical measurement apparatus is used for measuring voltage in multi-phase mains electricity supply arrangements such as a split-phase supply arrangement, a three phase supply arrangement or even a supply arrangement with more than three phases. According to such further embodiments plural voltage measurement apparatus of the form shown in FIG. 5 are used to measure voltage in respective different conductors of the multi-phase mains electricity supply arrangement. Application of electrical measurement apparatus to DC voltage measurement and in multi-phase mains electricity supply arrangements is described further in WO 2014/072733. DC voltage measurement is, for example, performed in electrical apparatus comprising an electric battery, such as propulsion apparatus.

Figure 6:
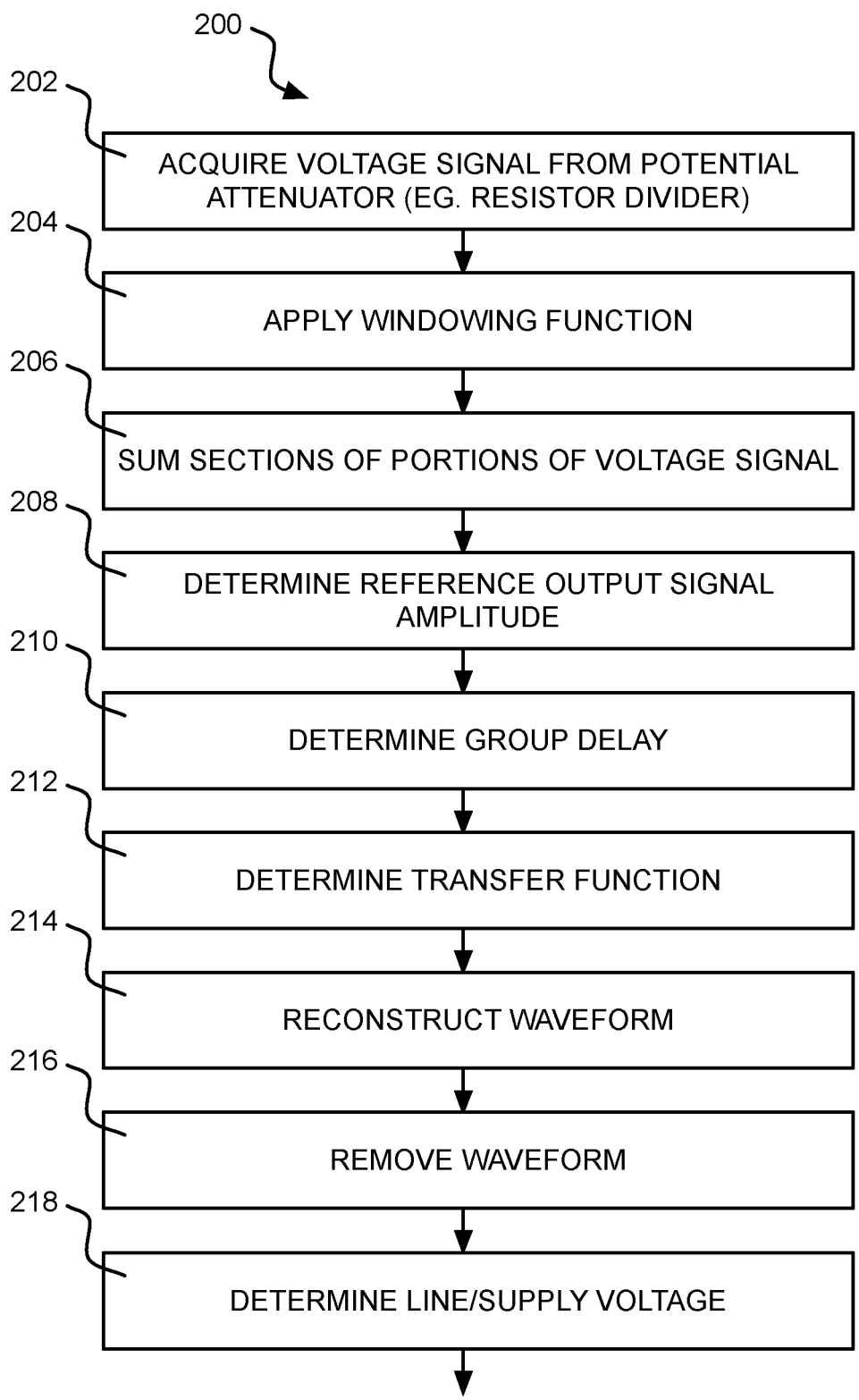
FIG. 6 is a flow chart representation of a method according to the invention performed by way of the embodiment of FIG. 5.

The electrical measurement apparatus 150 of FIG. 5 operates in a similar fashion to the current measurement apparatus of FIG. 1. Operational steps of the electrical measurement apparatus 150 of FIG. 5 are represented in the flow chart 200 shown in FIG. 6. Operation of the electrical measurement apparatus 150 of FIG. 5 will now be described. The signal source 162 is configured to apply a reference input signal to the potential attenuator 152, 154 under the control of the timing component 172. The reference input signal has a repeating cycle in the range of a few hertz to a few tens of kHz. The reference input signal has a frequency largely between harmonics of the fundamental frequency of the line voltage signal. Alternatively the reference input signal frequency is locked to a harmonic of the fundamental frequency of the line voltage signal. The reference input signal is of substantially piecewise constant form such as a square wave, a bitstream having sections of highs and lows with different duty cycles, a staircase waveform or a stepped waveform. A typical reference input signal is 200 mV peak to peak. The applied reference input signal is sensed by the second resistor 152 along with the line voltage signal which in the present embodiment is a 50 Hz mains voltage signal. The voltage measuring apparatus 164 is operative to acquire voltage signals developed across the reference resistor 152 and to generate acquired voltage signals (which constitute output signals) 202. An acquired voltage signal comprises an electrical output signal corresponding to the line voltage signal and a reference output signal corresponding to the reference input signal. The acquired voltage signal is received by the windowing component 168, which is operative to multiply the acquired voltage signal by the windowing function 204. The windowing function is of a length corresponding to plural cycles of the reference input signal, such as two hundred cycles. The windowing function is operative to attenuate the amplitude of part of the acquired voltage signal towards opposite ends of the window defined by the windowing function and thereby provide for improved rejection of the reference output signal during the subsequent summing operation. FIG. 3A shows a length of acquired voltage signal 62, a windowing function 64 and the length of acquired voltage signal after application of the windowing function 66. The application of the windowing function is liable to cause a loss in power from the output signal. In certain forms of the embodiment loss of power is addressed by applying the windowing function to overlapping parts of the output signal. This involves applying the windowing function to a first length of the acquired voltage signal and applying the windowing function to a second length of the acquired voltage signal, with the first and second lengths overlapping each other to an extent sufficient to minimise the power loss. In certain forms of the invention such overlapping streams of acquired voltage signal data are partially processed as described above with reference to one stream of data before being subsequently combined. For example the summing operation is performed separately on each stream and their levels determined separately. Alternatively the overlapping streams are processed together by summing the streams together. Application of the windowing function is under the control of the timing component 172 to provide for synchronisation of application of the windowing function to the acquired voltage signal with cycles of the reference input signal as applied by the signal source 162.

Thereafter the windowed length of voltage signal is received by the summing component 170 which is operative to decompose the length of voltage signal into plural portions with each portion corresponding to a cycle of the reference input signal. Where, for example, the voltage signal has a length of two hundred cycles the length of voltage signal is decomposed into two hundred portions. The summing component 170 then operative to sum sections of the two hundred portions, with each of the summed sections corresponding to at least a part and to a same part of the cycle of the reference input signal 206. The summing operation and the subsequent level determining operation within the level determining component 174 are carried in accordance with several different approaches.

According to a first approach the entire portions of the voltage signal are summed to provide a cumulative representation. Summing the portions in this fashion removes the electrical output signal on account of the electrical output signal being of a different period to the reference output signal or of changing phase with respect to the reference output signal. The cumulative representation is then divided by the number of summed portions to provide a representation of amplitude commensurate with the reference input signal. Alternatively division by the number of summed portions takes place at a later step in the present approach. A typical voltage signal comprises parts consisting of a slow rise or fall following each transition of the piecewise constant waveform followed perhaps by ringing. An example voltage signal of a length corresponding to several cycles 70 of the reference input signal is shown in FIG. 3B. The voltage signal comprises rising parts 72, falling parts 74, high levels 76 and low levels 78. The summing component 170 is therefore operative to exclude such rising and falling parts and to select the generally settled parts of the voltage signal. The rising and falling parts are excluded following analysis of the voltage signal involving comparison of the rate of change of the voltage signal with a threshold value. Alternatively rising and falling parts are excluded on the basis of pre-characterisation of the measurement arrangement which determines the rising and falling parts to be of a certain length following a transition in the reference input signal. Parts of corresponding level in the cumulative representation are then summed. For example and where the reference input signal is a square wave the high levels are all summed and the low levels are all summed to provide a summed high level and a summed low level respectively. The summed high level and the summed low level are then divided by the number of summed levels to provide an average high level and an average low level. Alternatively and similar to the division following the formation of the cumulative representation the division takes place later in the present approach. Irrespective of whether division is in the summing component or subsequently the effect is to provide an average level. Then the summed or average low is subtracted in the level determining component 174 from the summed or average high to provide a reference output signal amplitude 208.

According to a second approach the summing component is operative to sum parts of corresponding level in the portions of the voltage signal to provide two cumulative representations. For example the summing component is operative to sum all the high levels in the portions to provide a summed high level and to sum all the low levels in the portions to provide a summed low level. The rising and falling parts are excluded from the summing operations as described above with reference to the first approach. The summed high and low levels are then divided by the number of summed levels to provide average levels. Alternatively the division takes place after the following subtraction step. Then the summed low level or average summed low level is subtracted in the level determining component 174 from the summed high level or average summed low level to provide a reference output signal amplitude 208.

According to a third approach the summing component is operative to provide a reference output signal amplitude, which constitutes a cumulative representation, by summing the selected high levels and subtracting the selected low levels on an ongoing basis as the voltage signal is received 208. The operations of the summing component 170 and the level determining component 174 are thus combined. As described above the reference output signal is divided by the number of summed levels. Alternatively the division takes place earlier in the approach, such as in respect of each level before it is either summed or subtracted.

The reference output signal amplitude is received by the transfer function determining component 176 which is operative to determine a transfer function in respect of the gain of the measurement arrangement by dividing the reference output signal amplitude by the amplitude of the reference input signal 212. In certain forms the transfer function determining component 176 is also operative to determine a group delay for the measurement arrangement by determining a time delay between an edge in the reference input signal and the corresponding edge in the reference output signal as represented by the acquired voltage signal 210. Where the windowing function causes loss of power from the reference output signal amplitude the transfer function determining component 176 is operative to compensate for such loss of power.

The electrical measurement apparatus is operative such that the waveform reconstruction component 182 receives an input from the summing component 170. The waveform reconstruction component 172 is operative to provide a cumulative representation of a length of the voltage signal corresponding to a complete cycle of the reference input signal, i.e. a complete cumulative representation 214. Operation of the waveform reconstruction component 182 depends on operation of the summing component 170. Where the summing component 170 is operative according to the first approach the cumulative representation formed by summing entire portions of the voltage signal is already complete and is thus provided to the waveform reconstruction component 182 and no reconstruction is required. Where the summing component 170 is operative according to the second or third approach the waveform reconstruction component 182 is operative to form a complete cumulative representation from the different levels used to determine the reference output signal amplitude and the disregarded rising and falling parts. The complete cumulative representation is scaled to compensate for operations performed prior to formation of the complete cumulative representation, such as summing and windowing operations, whereby the complete cumulative representation corresponds to the acquired voltage signal from which it is subtracted in the waveform removal component 184 as described below.

FIG. 3C is a plot which illustrates operation of the waveform removal component 184. The waveform removal component 184 receives an input from the voltage measuring apparatus 164, 82 and the complete cumulative representation 84 from the waveform reconstruction component 182 and is operative to subtract the complete cumulative representation, which corresponds to the reference output signal, from the acquired voltage signal to leave the electrical output signal comprised in the acquired voltage signal 216, 86. The line voltage determining component 186 receives the output from the waveform removal component 184 and the transfer function from the transfer function determining component 176 and is operative to determine the line voltage by applying the inverse of the received transfer function to the output from the waveform removal component 184, 218. The determined line voltage is then provided by the line voltage determining component 186 for application elsewhere, such as in determination of power consumption or the like as described in detail in WO 2014/072733.

Further to the operations described above the control component 178 provides for rejection of parts of the acquired voltage signal where such rejected parts comprise impulse noise of an extent that would prejudice proper operation of the electrical measurement apparatus. The control component 178 also provides for determination of the level of noise present in the acquired voltage signal by analysing the acquired voltage signal when no reference input signal is applied to the potential attenuator 154,152. The control component 178 is further operative to provide an indication of accuracy of voltage measurement in dependence on the determined level of noise.

Reduction in the line voltage noise in the computation of the reference output signal is achieved by means of the same form as described above for the apparatus of FIG. 4 by further measurement of the line voltage. This approach is described further in WO 2014/072733.

Figure 7A:
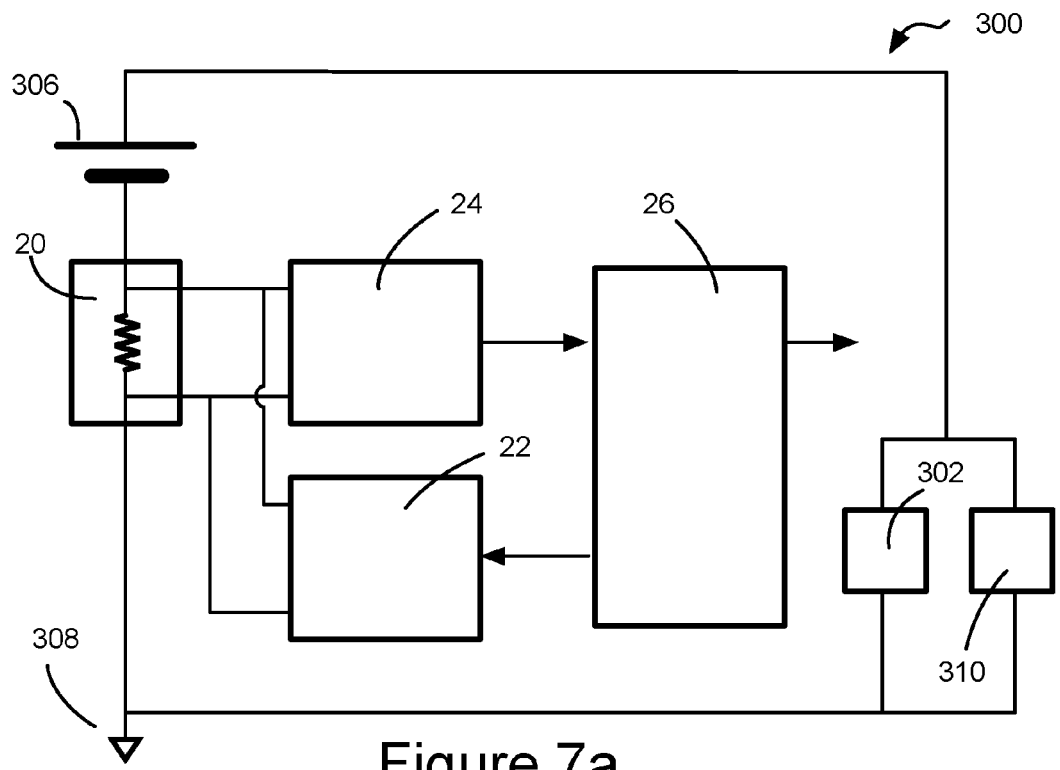
FIG. 7A is an embodiment of the present invention applied to DC apparatus with low side current sensing.

The present invention is applicable in DC apparatus. An example of such DC apparatus is propulsion apparatus comprising an electric battery. A block diagram representation of DC apparatus 300 in which electrical measurement apparatus embodying the present invention is used for low side current sensing is shown in FIG. 7A. The DC apparatus 300 of FIG. 7A is comprised in an electric vehicle or other battery powered device. The DC apparatus 300 comprises a battery 306. The delivered and charging current of the battery 306 is measured through a low-side sensor in the form of a shunt resistor 20. The DC apparatus 300 further comprises a signal source 22, voltage measuring apparatus 24 and processing apparatus 26 of a form and function as described above with reference to FIG. 1. The common node 308 between the battery 306 and a load 302 and a recharging circuit 310 is represented in FIG. 7A as an effective ground point.

When a load current is delivered by the battery 306 to the load 302, the shunt resistor 20 passes the same load current. When the recharging circuit 310, e.g. a dynamo, recharges the battery 306 the current flowing into the shunt resistor 20 is the battery charging current. The shunt resistor 20 is therefore operative to measure current during discharging and charging of the battery. In the DC apparatus of FIG. 7A the load current changes significantly by orders of magnitude from mA's to 1000's Amps. Also the load current can have different frequency components depending on the nature of the load and on switching of the load. The description provided above in respect of FIGS. 1, 2, 3A and 3B explains how the processing apparatus 26 is operative to extract at least one of a load output current, a transfer function of the current measurement apparatus and a change in a transfer function of the current measurement apparatus.

Figure 7B:
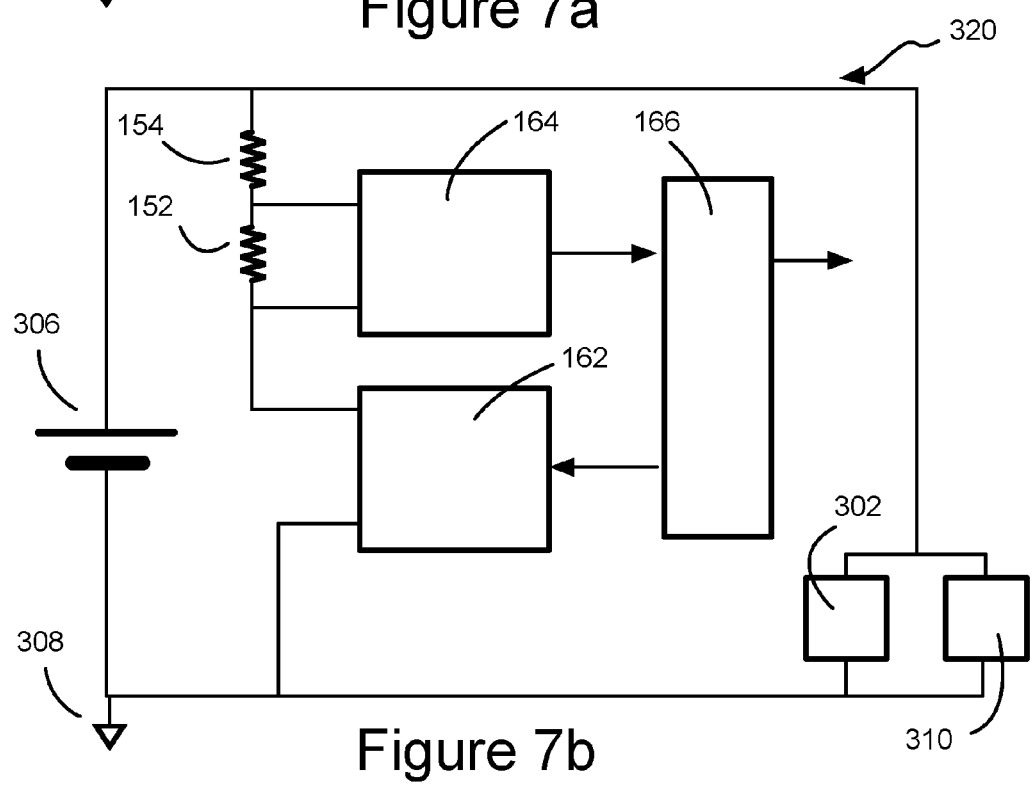
FIG. 7B is an embodiment of the present invention applied to DC apparatus comprising a potential divider which is operative to measure voltage.

A block diagram representation of DC apparatus 320 in which electrical measurement apparatus embodying the present invention is used for battery voltage measurement is shown in FIG. 7A. The DC apparatus 320 of FIG. 7B is comprised in an electric vehicle or other battery powered device. The DC apparatus 320 comprises a battery 306. The voltage of the battery 306 is measured through a potential divider 154, 152. The DC apparatus 300 further comprises a signal source 162, voltage measuring apparatus 164 and processing apparatus 166 of a form and function as described above with reference to FIG. 5. The common node 308 between the battery 306 and a load 302 and a recharging circuit 310 is represented in FIG. 7B as an effective ground point.

When a load current is delivered by the battery 306 to the load 302, or when the recharging circuit 310, e.g. a dynamo, recharges the battery 306 the potential divider 154, 152 attenuates the line voltage provided at the battery to a suitable level to be measured. In this way the battery can be monitored during different stages of discharging and charging. In the DC apparatus of FIG. 7B the battery voltage can change significantly from a few volts to 10's volts. Also the battery voltage can have different frequency components depending on the nature of the load and on switching of the load. The description provided above in respect of FIGS. 5, 6, 3A and 3B explains how the processing apparatus 166 is operative to extract at least one of the line voltage, a transfer function of the voltage measurement apparatus and a change in a transfer function of the voltage measurement apparatus.

The invention claimed is:

1. An apparatus configured to measure an electrical signal in an electrical circuit, the apparatus comprising:
   a signal source configured to provide a reference input signal to a measurement circuit, wherein an output signal from the measurement circuit comprises an electrical output signal corresponding to the electrical signal and a reference output signal corresponding to the reference input signal, the reference input signal having a substantially piecewise form repeated over multiple cycles; and
   a processing circuit configured to determine a cumulative representation indicative of the electrical signal by summing plural received sections of the output signal, each of the sections corresponding to at least a part of the cycle of the reference input signal.

2. The apparatus of claim 1, wherein the electrical circuit bears a current signal, the measurement circuit is configured to measure the current signal and the electrical output signal comprised in the output signal corresponds to the current signal.

3. The apparatus of claim 2, wherein the measurement circuit comprises a current sensor configured to measure the current signal and the signal source is configured to apply the reference input signal as a current.

4. The apparatus of claim 1, wherein the electrical circuit bears a voltage signal, the measurement circuit is configured to measure the voltage signal and the electrical output signal comprised in the output signal corresponds to the voltage signal.

5. The apparatus of claim 4, wherein the measurement circuit comprises a potential attenuator configured to measure the voltage signal and the signal source is configured to apply the reference input signal as a voltage.

6. The apparatus of claim 1, wherein the processing circuit is further configured to determine a transfer function of the measurement circuit using the cumulative representation.

7. The apparatus of claim 1, wherein the processing circuit configured to sum plural different parts of the cumulative representation and divide the summed plural parts by the number of parts to provide an averaged cumulative representation.

8. The apparatus of claim 6, wherein the processing circuit is configured to determine the transfer function using less than a whole cycle of the reference input signal and the cumulative representation corresponds to less than a whole cycle of the reference input signal.

9. The apparatus of claim 6, wherein the processing circuit is configured to determine the transfer function using a cumulative amplitude characteristic of the cumulative representation and a reference amplitude characteristic of the reference input signal.

10. The apparatus of claim 1, wherein the processing circuit is further configured to determine a change in a transfer function for the measurement circuit using the cumulative representation.

11. The apparatus of claim 1, wherein summing plural received sections of the output signal comprises summing corresponding subsections of the plural received sections, the corresponding subsections being selected using at least one of: pre-characterisation of behaviour of the measurement arrangement; and analysis of behaviour of the measurement arrangement during operation of the apparatus.

12. The apparatus of claim 6, wherein the processing circuit is further configured to determine the transfer function using a part of the cycle of the reference input signal that includes a transition related variation.

13. The apparatus of claim 12, wherein the processing circuit is further configured to apply different transfer function weighting for different respective parts of the cycle.

14. The apparatus of claim 6, wherein the processing circuit is further configured to determine a time delay of at least one transition of the reference output signal relative to a respective at least one transition of the reference input signal, and wherein the processing circuit is configured to determine the transfer function using the time delay and at least one cumulative amplitude characteristic of the cumulative representation.

15. The apparatus of claim 1, wherein the processing circuit is further configured to determine the cumulative representation on an ongoing basis wherein a first cumulative representation is determined by summing a first plurality of received sections of the output signal and a second cumulative representation is determined by summing a second plurality of received sections of the output signal, the second plurality of received sections comprising at least one more recently received section absent from the first plurality.

16. The apparatus of claim 1, wherein the processing circuit is further configured to apply a windowing function to the output signal before determining the at least one cumulative representation.

17. The apparatus of claim 16, wherein the windowing function is configured to attenuate an amplitude of the output signal corresponding to opposite ends of a window defined by the windowing function.

18. The apparatus of claim 16, wherein the processing circuit is configured to determine the cumulative representation by summing corresponding ones of plural received sections of the output signal which overlap with each other, and wherein the processing circuit is configured to apply the windowing function to the overlapping received sections.

19. The apparatus of claim 6, wherein the processing circuit is configured to scale the transfer function to compensate for scaling caused by at least one of: summing of the plural received sections of the output signal; and application of a windowing function to the output signal.

20. The apparatus of claim 1, wherein the processing circuit is further configured to determine information about the electrical signal using the cumulative representation.

21. The apparatus of claim 1, wherein the measurement circuit is further configured to measure the electrical signal in an absence of the reference input signal and wherein the processing circuit is configured to determine the cumulative representation after subtracting the measurement of the electrical signal measured in the absence of the reference input signal from the output signal.

22. The apparatus of claim 1, wherein the processing circuit is further configured to remove the reference output signal from the output signal by subtracting the determined cumulative representation from the output signal.

23. The apparatus of claim 1, wherein the reference input signal comprises at least one of: a pulse waveform; a bitstream having sections of highs and lows with different duty cycles; a staircase waveform; and a stepped waveform.

24. The apparatus of claim 1, wherein the processing circuit is further configured to determine multiple cumulative representations indicative of the electrical signal, and wherein the processing circuit is further configured to identify at least one cumulative representation from the determined multiple cumulative representations that deviates from the other cumulative representations.

25. The apparatus of claim 1, further comprising the measurement circuit, wherein the measurement circuit comprises a first and second sensors in a signal path that is configured to carry the electrical signal;
wherein one of the first and second sensors is configured to receive the electrical signal and the other of the first and second sensors is configured to receive the electrical signal and the reference input signal from the signal source; and
wherein the output signal from the measurement circuit includes a difference between signals measured using the first and second sensors.

26. An electrical measurement method comprising:
using a signal source, applying a reference input signal to a measurement circuit that is coupled to an electrical circuit which bears an electrical signal, wherein the reference input signal has a substantially piecewise form repeated over multiple cycles;
receiving an output signal from the measurement arrangement using a processing circuit, the output signal comprising an electrical output signal corresponding to the electrical signal and a reference output signal corresponding to the reference input signal; and
determining a cumulative representation using the processing circuit, including summing plural received sections of the output signal, each of the sections corresponding to at least a part of the cycle of the reference input signal.

27. The method of claim 26, wherein the applying the reference input signal includes applying the reference input signal to a measurement circuit that is coupled to an AC circuit which bears an AC signal to be measured.

28. The method of claim 26, wherein the determining the cumulative representation includes using less than a whole cycle of the reference input signal.

29. The method of claim 26, further comprising determining a transfer function for the measurement circuit using the cumulative representation.

30. The method of claim 26, further comprising determining a change in a transfer function for the measurement circuit using the cumulative representation.

31. The method of claim 26, further comprising determining information about the electrical signal using the cumulative representation.

32. The method of claim 26, wherein the applying the reference input signal includes applying the reference input signal to a measurement circuit that is coupled to a DC circuit which bears a DC signal to be measured.

33. An electrical apparatus comprising:
a first circuit configured to carry a first electrical signal;
a measurement circuit coupled to the first circuit, the measurement circuit configured to measure information about the first electrical signal in the first circuit;
a signal source configured to provide a reference input signal to the measurement circuit, wherein an output signal from the measurement circuit comprises an electrical output signal corresponding to the first electrical signal and a reference output signal corresponding to the reference input signal, the reference input signal having a substantially piecewise form over multiple signal cycles; and
a processing circuit configured to determine a cumulative representation indicative of the first electrical signal using information about multiple received sections of the output signal, each of the sections corresponding to at least a part of a cycle of the reference input signal.

34. The electrical apparatus of claim 33, wherein the first circuit comprises a DC circuit configured to carry a first DC signal, and wherein the measurement circuit is configured to measure information about a current sourced or sunk by the DC circuit.

35. The electrical apparatus of claim 33, wherein the first circuit comprises a DC circuit configured to carry a first DC signal, and wherein the measurement circuit is configured to measure information about a voltage between two conductors in the DC circuit.

36. The electrical apparatus of claim 33, wherein the first circuit comprises a battery circuit or a battery charger circuit.

37. The electrical apparatus of claim 33, wherein the first circuit comprises an AC circuit configured to carry a first AC signal, and wherein the measurement circuit is configured to measure information about a current sourced or sunk by the AC circuit.

38. The electrical apparatus of claim 33, wherein the first circuit comprises an AC circuit configured to carry a first AC signal, and wherein the measurement circuit is configured to measure information about a voltage between two conductors in the AC circuit.

39. The electrical apparatus of claim 33, wherein the first circuit is configured to carry multiple different electrical signals in respective different conductors, wherein the signal source is multiplexed to provide respective reference input signals to the respective different conductors, and wherein the processing circuit is configured to determine respective cumulative representations of the electrical signals based on the respective reference input signals provided to the different conductors.

* * * * *

UNITED STATES PATENT AND TRADEMARK OFFICE
CERTIFICATE OF CORRECTION

PATENT NO. : 9,823,275 B2  
APPLICATION NO. : 14/895868  
DATED : November 21, 2017  
INVENTOR(S) : Danesh et al.

Page 1 of 1

It is certified that error appears in the above-identified patent and that said Letters Patent is hereby corrected as shown below:

In the Claims

In Column 27, Line 42, in Claim 7, after "circuit", insert --is--

In Column 27, Line 66, in Claim 11, delete "arrangement;" and insert --circuit;-- therefor In Column 27, Line 67, in Claim 11, delete "arrangement" and insert --circuit-- therefor In Column 28, Line 60, in Claim 23, after "of:", insert --¶--

In Column 28, Line 60, in Claim 23, after "waveform;", insert --¶--

In Column 28, Line 62, in Claim 23, after "cycles;", insert --¶--

In Column 28, Line 62, in Claim 23, after "and", insert --¶--

In Column 29, Lines 22-23, in Claim 26, delete "arrangement" and insert --circuit-- therefor Signed and Sealed this  
Twenty-eighth Day of May, 2019

Andrei Iancu  
*Director of the United States Patent and Trademark Office*